(12) United States Patent
Shinriki et al.

(10) Patent No.: US 7,799,674 B2
(45) Date of Patent: Sep. 21, 2010

(54) RUTHENIUM ALLOY FILM FOR COPPER INTERCONNECTS

(75) Inventors: Hiroshi Shinriki, Tama (JP); Hiroaki Inoue, Tama (JP)

(73) Assignee: ASM Japan K.K., Tokyo (JP)

( * ) Notice: Subject to any disclaimer, the term of this patent is extended or adjusted under 35 U.S.C. 154(b) by 187 days.

(21) Appl. No.: 12/129,345

(22) Filed: May 29, 2008

(65) Prior Publication Data
US 2009/0209101 A1    Aug. 20, 2009

Related U.S. Application Data

(60) Provisional application No. 61/029,851, filed on Feb. 19, 2008.

(51) Int. Cl.
| | |
|---|---|
| H01L 21/4763 | (2006.01) |
| H01L 21/44 | (2006.01) |
| H01L 21/302 | (2006.01) |
| H01L 21/461 | (2006.01) |
| H01L 29/40 | (2006.01) |
| H01L 23/52 | (2006.01) |
| H01L 23/48 | (2006.01) |

(52) U.S. Cl. .................. 438/627; 438/650; 438/675; 438/687; 257/751; 257/E21.495

(58) Field of Classification Search ......... 438/625–629, 438/637, 642–644, 650, 658, 676, 680, 686–687
See application file for complete search history.

(56) References Cited

U.S. PATENT DOCUMENTS

| | | | |
|---|---|---|---|
| 4,058,430 A | 11/1977 | Suntola et al. | |
| 4,477,296 A | 10/1984 | Nair | |
| 4,604,118 A | 8/1986 | Bocko et al. | |
| 4,670,110 A | 6/1987 | Withers et al. | |
| 4,860,687 A | 8/1989 | Frijlink | |
| 4,902,551 A | 2/1990 | Nakaso et al. | |
| 4,965,656 A | 10/1990 | Koubuchi et al. | |
| 5,106,454 A | 4/1992 | Allardyce et al. | |

(Continued)

FOREIGN PATENT DOCUMENTS

DE           41 08 73        8/1923

(Continued)

OTHER PUBLICATIONS

Hoyas et al., Growth and characterization of atomic layer deposited WC0.7N0.3 on polymer films, Journal of Applied Physics, Jan. 1, 2004, vol. 95, Issue 1, pp. 381-388.

(Continued)

*Primary Examiner*—Ha Tran T Nguyen
*Assistant Examiner*—Valerie Brown
(74) *Attorney, Agent, or Firm*—Knobbe, Martens, Olson & Bear LLP

(57) ABSTRACT

A method for forming interconnect wiring, includes: (i) covering a surface of a connection hole penetrating through interconnect dielectric layers formed on a substrate for interconnect wiring, with an underlying alloy layer selected from the group consisting of an alloy film containing ruthenium (Ru) and at least one other metal atom (M), a nitride film thereof, a carbide film thereof, and an nitride-carbide film thereof, and (ii) filling copper or a copper compound in the connection hole covered with the underlying layer.

23 Claims, 18 Drawing Sheets

U.S. PATENT DOCUMENTS

| | | | |
|---|---|---|---|
| 5,382,333 | A | 1/1995 | Ando et al. |
| 5,391,517 | A | 2/1995 | Gelatos et al. |
| 5,453,494 | A | 9/1995 | Kirlin et al. |
| 5,637,533 | A | 6/1997 | Choi |
| 5,695,810 | A | 12/1997 | Dubin et al. |
| 5,711,811 | A | 1/1998 | Suntola |
| 5,731,634 | A | 3/1998 | Matsuo et al. |
| 5,820,664 | A | 10/1998 | Gardiner et al. |
| 5,865,365 | A | 2/1999 | Nishikawa et al. |
| 5,884,009 | A | 3/1999 | Okase |
| 5,916,365 | A | 6/1999 | Sherman |
| 5,923,056 | A | 7/1999 | Lee et al. |
| 5,939,334 | A | 8/1999 | Nguyen et al. |
| 5,989,672 | A | 11/1999 | Hayashi |
| 5,998,048 | A | 12/1999 | Jin et al. |
| 6,006,763 | A | 12/1999 | Mori et al. |
| 6,015,986 | A | 1/2000 | Schuegraf |
| 6,033,584 | A | 3/2000 | Ngo et al. |
| 6,040,243 | A | 3/2000 | Li et al. |
| 6,063,705 | A | 5/2000 | Vaartstra |
| 6,066,892 | A | 5/2000 | Ding et al. |
| 6,074,945 | A | 6/2000 | Vaartstra et al. |
| 6,108,937 | A | 8/2000 | Raaijmakers |
| 6,124,189 | A | 9/2000 | Watanabe et al. |
| 6,130,123 | A | 10/2000 | Liang et al. |
| 6,133,159 | A | 10/2000 | Vaartstra et al. |
| 6,136,163 | A | 10/2000 | Cheung et al. |
| 6,139,700 | A | 10/2000 | Kang et al. |
| 6,143,658 | A | 11/2000 | Donnelly et al. |
| 6,144,060 | A | 11/2000 | Park et al. |
| 6,171,910 | B1 | 1/2001 | Hobbs et al. |
| 6,203,613 | B1 | 3/2001 | Gates et al. |
| 6,268,291 | B1 | 7/2001 | Andricacos et al. |
| 6,270,572 | B1 | 8/2001 | Kim et al. |
| 6,281,125 | B1 | 8/2001 | Vaartstra et al. |
| 6,294,467 | B1 | 9/2001 | Yokoyama et al. |
| 6,297,539 | B1 | 10/2001 | Ma et al. |
| 6,303,500 | B1 | 10/2001 | Jiang et al. |
| 6,305,314 | B1 | 10/2001 | Sneh et al. |
| 6,306,756 | B1 | 10/2001 | Hasunuma et al. |
| 6,320,213 | B1 | 11/2001 | Kirlin et al. |
| 6,323,131 | B1 | 11/2001 | Obeng et al. |
| 6,335,280 | B1 | 1/2002 | Van der Jeugd |
| 6,342,277 | B1 | 1/2002 | Sherman |
| 6,346,151 | B1 | 2/2002 | Jiang et al. |
| 6,359,159 | B1 | 3/2002 | Welch et al. |
| 6,380,080 | B2 | 4/2002 | Visokay |
| 6,391,785 | B1 | 5/2002 | Satta et al. |
| 6,395,650 | B1 | 5/2002 | Callegari et al. |
| 6,403,414 | B2 | 6/2002 | Marsh |
| 6,404,191 | B2 | 6/2002 | Daughton et al. |
| 6,420,189 | B1 | 7/2002 | Lopatin |
| 6,433,432 | B2 | 8/2002 | Shimizu |
| 6,444,568 | B1 | 9/2002 | Sundararajan et al. |
| 6,444,868 | B1 | 9/2002 | Vaughn et al. |
| 6,455,424 | B1 | 9/2002 | McTeer et al. |
| 6,464,779 | B1 | 10/2002 | Powell et al. |
| 6,475,276 | B1 | 11/2002 | Elers et al. |
| 6,478,931 | B1 | 11/2002 | Wadley et al. |
| 6,482,733 | B2 | 11/2002 | Raaijmakers et al. |
| 6,482,740 | B2 | 11/2002 | Soininen et al. |
| 6,511,539 | B1 | 1/2003 | Raaijmakers |
| 6,534,395 | B2 | 3/2003 | Werkhoven et al. |
| 6,541,067 | B1 | 4/2003 | Marsh et al. |
| 6,551,399 | B1 | 4/2003 | Shen et al. |
| 6,576,053 | B1 | 6/2003 | Kim et al. |
| 6,586,330 | B1 | 7/2003 | Ludviksson et al. |
| 6,593,656 | B2 | 7/2003 | Ahn et al. |
| 6,617,173 | B1 | 9/2003 | Shen |
| 6,649,091 | B2 | 11/2003 | Ryan et al. |
| 6,656,748 | B2 | 12/2003 | Hall et al. |
| 6,664,192 | B2 | 12/2003 | Satta et al. |
| 6,679,951 | B2 | 1/2004 | Soininen et al. |
| 6,680,540 | B2 | 1/2004 | Nakano et al. |
| 6,703,708 | B2 | 3/2004 | Werkhoven et al. |
| 6,720,262 | B2 | 4/2004 | Koh et al. |
| 6,759,325 | B2 | 7/2004 | Raaijmakers et al. |
| 6,777,331 | B2 | 8/2004 | Nguyen |
| 6,784,101 | B1 | 8/2004 | Yu et al. |
| 6,784,504 | B2 | 8/2004 | Derderian et al. |
| 6,800,542 | B2 | 10/2004 | Kim |
| 6,800,567 | B2 | 10/2004 | Cho et al. |
| 6,824,816 | B2 | 11/2004 | Aaltonen et al. |
| 6,842,740 | B1 | 1/2005 | Jeran et al. |
| 6,849,122 | B1 | 2/2005 | Fair |
| 6,852,635 | B2 | 2/2005 | Satta et al. |
| 6,878,628 | B2 | 4/2005 | Sophie et al. |
| 6,881,260 | B2 | 4/2005 | Marsh et al. |
| 6,881,437 | B2 | 4/2005 | Ivanov et al. |
| 6,887,795 | B2 | 5/2005 | Soininen |
| 6,921,712 | B2 | 7/2005 | Soininen et al. |
| 6,933,225 | B2 | 8/2005 | Werkhoven et al. |
| 6,936,535 | B2 | 8/2005 | Kim et al. |
| 6,955,986 | B2 | 10/2005 | Li |
| 6,984,591 | B1 | 1/2006 | Buchanan et al. |
| 7,011,981 | B2 | 3/2006 | Kim et al. |
| 7,067,407 | B2 | 6/2006 | Kostamo |
| 7,105,054 | B2 | 9/2006 | Lindfors |
| 7,107,998 | B2 | 9/2006 | Greet et al. |
| 7,118,779 | B2 | 10/2006 | Verghese et al. |
| 7,135,207 | B2 | 11/2006 | Min et al. |
| 7,220,451 | B2 | 5/2007 | Bates et al. |
| 7,220,669 | B2 | 5/2007 | Hujanen et al. |
| 7,241,677 | B2 | 7/2007 | Soinenen et al. |
| 7,256,144 | B2 | 8/2007 | Koyanagi et al. |
| 7,273,526 | B2 | 9/2007 | Shinriki et al. |
| 7,273,814 | B2 | 9/2007 | Matsuda |
| 7,300,873 | B2 | 11/2007 | Millward |
| 7,404,985 | B2 | 7/2008 | Chang et al. |
| 7,419,903 | B2 | 9/2008 | Haukka et al. |
| 7,435,484 | B2 | 10/2008 | Shinriki et al. |
| 7,438,949 | B2 | 10/2008 | Weidman |
| 7,476,618 | B2 | 1/2009 | Kilpela et al. |
| 7,494,927 | B2 | 2/2009 | Kostamo et al. |
| 7,541,284 | B2 | 6/2009 | Park |
| 7,666,773 | B2 | 2/2010 | Huotari et al. |
| 2001/0003064 | A1 | 6/2001 | Ohto |
| 2001/0013617 | A1 | 8/2001 | Toyoda et al. |
| 2001/0018266 | A1 | 8/2001 | Jiang et al. |
| 2001/0030366 | A1 | 10/2001 | Nakano et al. |
| 2001/0041250 | A1 | 11/2001 | Werkhoven et al. |
| 2001/0052318 | A1 | 12/2001 | Jiang et al. |
| 2002/0004293 | A1 | 1/2002 | Soininen et al. |
| 2002/0006711 | A1 | 1/2002 | Yamazaki et al. |
| 2002/0013487 | A1 | 1/2002 | Norman et al. |
| 2002/0027286 | A1 | 3/2002 | Sundararajan et al. |
| 2002/0173054 | A1 | 11/2002 | Kim |
| 2003/0013302 | A1 | 1/2003 | Nguyen et al. |
| 2003/0059535 | A1 | 3/2003 | Luo et al. |
| 2003/0100162 | A1 | 5/2003 | Joo |
| 2003/0135061 | A1 | 7/2003 | Norman et al. |
| 2003/0165615 | A1 | 9/2003 | Aaltonen et al. |
| 2003/0214043 | A1 | 11/2003 | Saitoh et al. |
| 2003/0219991 | A1 | 11/2003 | Geusic et al. |
| 2003/0233976 | A1 | 12/2003 | Marsh et al. |
| 2004/0005753 | A1 | 1/2004 | Kostamo et al. |
| 2004/0028952 | A1 | 2/2004 | Cartier et al. |
| 2004/0038529 | A1 | 2/2004 | Soininen et al. |
| 2004/0053496 | A1 | 3/2004 | Choi |
| 2004/0082125 | A1 | 4/2004 | Hou et al. |
| 2004/0087143 | A1 | 5/2004 | Norman et al. |
| 2004/0105934 | A1 | 6/2004 | Chang et al. |
| 2004/0118697 | A1 | 6/2004 | Wen et al. |
| 2004/0126944 | A1 | 7/2004 | Rotondaro et al. |

| | | | | | | |
|---|---|---|---|---|---|---|
| 2004/0142558 | A1* | 7/2004 | Granneman ............... 438/680 | KR | 10-2001-96408 | 11/2001 |
| 2004/0152255 | A1 | 8/2004 | Seidl et al. | KR | 10-2001-112889 | 12/2001 |
| 2004/0192021 | A1 | 9/2004 | Li | KR | 10-2003-0011399 | 2/2003 |
| 2004/0192036 | A1 | 9/2004 | Koyanagi et al. | KR | 1020050103373 | 10/2005 |
| 2004/0214354 | A1 | 10/2004 | Marsh et al. | WO | WO 93/10652 | 5/1993 |
| 2004/0216668 | A1 | 11/2004 | Lindfors et al. | WO | WO 98/01890 | 1/1998 |
| 2004/0224475 | A1 | 11/2004 | Lee et al. | WO | WO 99/17343 | 4/1999 |
| 2005/0009325 | A1 | 1/2005 | Chung et al. | WO | WO 00/03420 | 1/2000 |
| 2005/0020060 | A1 | 1/2005 | Aaltonen et al. | WO | WO 00/38191 | 6/2000 |
| 2005/0048794 | A1 | 3/2005 | Brask et al. | WO | WO 01/88972 | 5/2001 |
| 2005/0082587 | A1 | 4/2005 | Marsh | WO | WO 01/50502 | 7/2001 |
| 2005/0085031 | A1 | 4/2005 | Lopatin et al. | WO | WO 02/009126 | 7/2001 |
| 2005/0087879 | A1 | 4/2005 | Won et al. | WO | WO 02/009158 | 7/2001 |
| 2005/0089632 | A1 | 4/2005 | Vehkamaki et al. | WO | WO 03/023835 | 3/2003 |
| 2005/0092247 | A1 | 5/2005 | Schmidt et al. | WO | WO03/040150 | 5/2003 |
| 2005/0098440 | A1 | 5/2005 | Kailasan et al. | WO | WO 03/056612 A1 | 7/2003 |
| 2005/0124154 | A1 | 6/2005 | Park et al. | WO | WO2004/035858 | 4/2004 |
| 2005/0181555 | A1 | 8/2005 | Haukka et al. | WO | WO 2004/035858 | 4/2004 |
| 2005/0208754 | A1 | 9/2005 | Kostamo et al. | WO | WO 2006/035281 | 4/2006 |
| 2005/0229848 | A1 | 10/2005 | Shinriki et al. | | | |
| 2005/0238808 | A1 | 10/2005 | Gatineau et al. | | | |
| 2005/0271812 | A1 | 12/2005 | Myo et al. | | | |
| 2006/0013955 | A1 | 1/2006 | Senzaki | | | |
| 2006/0035462 | A1 | 2/2006 | Millward | | | |
| 2006/0073276 | A1 | 4/2006 | Antonissen | | | |
| 2006/0093848 | A1 | 5/2006 | Senkevich et al. | | | |
| 2006/0118968 | A1 | 6/2006 | Johnson et al. | | | |
| 2006/0121733 | A1 | 6/2006 | Kilpela et al. | | | |
| 2006/0128150 | A1 | 6/2006 | Gandikota et al. | | | |
| 2006/0137608 | A1 | 6/2006 | Choi et al. | | | |
| 2006/0177601 | A1 | 8/2006 | Park et al. | | | |
| 2006/0211228 | A1 | 9/2006 | Matsuda | | | |
| 2006/0216932 | A1 | 9/2006 | Kumar et al. | | | |
| 2006/0223300 | A1 | 10/2006 | Simka et al. | | | |
| 2006/0263977 | A1 | 11/2006 | Kim et al. | | | |
| 2007/0014919 | A1 | 1/2007 | Hamalainen et al. | | | |
| 2007/0026654 | A1 | 2/2007 | Huotari et al. | | | |
| 2007/0036892 | A1 | 2/2007 | Haukka et al. | | | |
| 2007/0059502 | A1 | 3/2007 | Wang et al. | | | |
| 2007/0082132 | A1* | 4/2007 | Shinriki et al. ........ 427/255.394 | | | |
| 2007/0190782 | A1 | 8/2007 | Park | | | |
| 2008/0038465 | A1 | 2/2008 | Dussurrat | | | |
| 2008/0054472 | A1* | 3/2008 | Shinriki et al. ............... 257/762 | | | |
| 2008/0124484 | A1* | 5/2008 | Shinriki et al. ............... 427/535 | | | |
| 2008/0146042 | A1 | 6/2008 | Kostamo et al. | | | |
| 2008/0171436 | A1 | 7/2008 | Koh et al. | | | |
| 2008/0206982 | A1* | 8/2008 | Suzuki ........................ 438/627 | | | |
| 2008/0214003 | A1 | 9/2008 | Xia | | | |
| 2008/0296768 | A1* | 12/2008 | Chebiam et al. ............ 257/751 | | | |
| 2008/0315418 | A1* | 12/2008 | Boyd et al. ................. 257/751 | | | |
| 2008/0318417 | A1 | 12/2008 | Shinriki et al. | | | |
| 2009/0068832 | A1 | 3/2009 | Haukka et al. | | | |
| 2009/0087339 | A1 | 4/2009 | Shinriki | | | |
| 2009/0104777 | A1 | 4/2009 | Kim | | | |
| 2009/0155997 | A1 | 6/2009 | Shinriki | | | |
| 2009/0163024 | A1 | 6/2009 | Kim et al. | | | |
| 2009/0209101 | A1 | 8/2009 | Shinriki et al. | | | |
| 2010/0055433 | A1 | 3/2010 | Shinriki et al. | | | |

FOREIGN PATENT DOCUMENTS

| | | |
|---|---|---|
| EP | 0 469 456 | 7/1991 |
| EP | 0 469 470 A1 | 2/1992 |
| EP | 0 880 168 A2 | 11/1998 |
| EP | 1 688 923 A2 | 8/2006 |
| GB | 368850 | 12/1930 |
| GB | 1518243 | 7/1978 |
| GB | 2 340 508 A | 2/2000 |
| JP | 1998-340994 | 12/1998 |
| JP | 2003-168738 A | 6/2003 |
| KR | 10-2001-004717 | 1/2001 |
| KR | 10-2001-004718 | 1/2001 |
| KR | 10-2001-004719 | 1/2001 |

OTHER PUBLICATIONS

Jeong et al., Plasma enhanced atomic layer deposition of Ru-TaN thin films for the application of Cu diffusion barrier, ALD Conference, 2006, pp. 1-23.

Kwon et al., Plasma-enhance atomic layer deposition of RuTiN thin films for the applicaiton of copper diffusion barrier, ALD Conference, 2004.

Rossnagel, The latest on Ru-Cu interconnect technology, Solid State Technology, 2005, Online, pp. 1-4.

Yang et al., Physical, electrical, and reliability characterization of Ru for Cu interconnects, 2006 International Interconnect Technology Conference, vol. ISBN 1-4244-0103-8/06, Pages pp. 187-190.

K. Namba et al., PEALD of Ru layer on WNC ALD barrier for Cu/porous low-k, Proceedings of Advanced Metallization Conference 2006, p. 39.

I. Shao et al., An alternative low resistance MOL technology with electroplated rhodium as contact plugs for 32nm CMOS and beyond, 1-4244-1070-3/07, 2007 IEEE.

V. Arnal et al., Materials and processes for high signal propagation performance and reliable 32 nm node BEOL., 1-4244-1069-X/07, 2007 IEEE, pp. 1-3.

Shinriki et al., U.S. Appl. No. 11/955,275, filed Dec. 12, 2007.
Koh et al., U.S. Appl. No. 11/972,081, filed Jan. 10, 2008.
U.S. Appl. No. 10/782,727, filed Feb. 18, 2004, Lindfors et al.
U.S. Appl. No. 11/254,071, filed Jun. 8, 2006, Kilpela.
U.S. Appl. No. 11/955,275, filed Dec. 12, 2007, Shinriki.
U.S. Appl. No. 12/201,434, Aug. 29, 2008, Shinriki et al.
U.S. Appl. No. 12/337,141, filed Dec. 17, 2008, Kim et al.
U.S. Appl. No. 60/976,378, filed Sep. 28, 2007, Shinriki.
U.S. Appl. No. 61/178,871, filed May 15, 2009, Hamalainen et al.

Aaltonen et al., Atomic Layer Deposition of Ruthenium Thin Films from Ru(thd)$_3$ and Oxygen, Chem. Vap. Deposition, 2004, vol. 10, Issue 4, pp. 215-219.

Aaltonen et al., Reaction Mechanism Studies on Atomic Layer Deposition of Ruthenium and Platinum, Electrochem. Solid-State Lett., 2003, vol. 6, pp. C130-C133.

Aaltonen et al., ALD of Rhodium Thin Films from Rh (acac)$_3$ and Oxygen, Electrochem. Solid-State Lett., 2005, vol. 8, Issue 8, pp. C99-C101.

Aaltonen et al., Atomic Layer Deposition of Iridium Thin Films, J. Electrochem. Soc., 2004, vol. 151, Issue 8, pp. G489-G492.

Aaltonen et al., Atomic Layer Deposition of Noble Metal Thin Films, dissertation presented at the University of Helsinki, 2005, Helsinki, Finland.

Aaltonen et al., Atomic Layer Deposition of Noble Metals: Exploration of the Low Limit of the Deposition Temperature, J. Mat. Res. Soc., 2004, vol. 19, Issue 11, pp. 3353-3358.

Aaltonen et al., Atomic Layer Deposition of Platinum Thin Films, Chem. Mater., 2003, vol. 15, pp. 1924-1928.

Addison et al., The Vapour Pressure of Anhydrous Copper Nitrate, and its Molecular Weight in the Vapour State, J. Chem. Soc., 1958, pp. 3099-3106.

Akerman et al, Identifying Tunneling in Ferromagnetic-Insulator-Ferromagnetic Thin Film Structures, World Wide Web, physics.ucsd.eduiksgrp/Tunneling.html, Sep. 10, 2008, pp. 1-7.

Aoyama et al., Chemical Vapor Deposition of Ru and Its Application in (Ba, Sr) TiO3 Capacitors for Future Dynamic Random Access Memories, Jpn. J. Appl. Phys. , 1999, vol. 38, Issue 43, pp. 2194-2199.

Baklanov et al., "Characterization of Cu surface cleaning by hydrogen plasma," Journal Vac. Sci. Technol 19(4): 1201-1211 (2001).

Baliga, New Designs and Materials Tackle 1 Gb Memory Challenge, Semiconductor International, Nov. 2000.

Basceri, Electrical and Dielectric Properties of (Ba,Sr) $TiO_3$ Thin Film Capacitors for Ultra-High Density Dynamic Random Access Memories, Thesis, NC State University, 1997, pp. 13-31, Raleigh, NC, USA.

Bobo et al., Spin Dependent Tunneling Junctions with Hard Magnetic Layer Pinning, Journal of Applied Physics, 1998, vol. 83, Issue 11, pp. 6685-6687.

Bursky, D., "Hit Up IEDM for Gigabit and Denser DRAMs and Merged Logic/Memory," Electronic Design, World Wide Web address: planetee.com, Dec. 1, 1998.

Campbell et al., "Titanium dioxide (TiO2)-based gate insulators," IBM J. Res. Develop., May 1999, pp. 383-392, vol. 43, No. 3.

Daughton, Advanced MRAM Concepts, World Wide Web: nve.com/otherbiz/mram2.pdf, Feb. 7, 2001, pp. 1-6.

Dussarret et al., Precursor for Film Formation and Method for Forming Ruthenium-Containing Film., WO 2006/035281 A1, Apr. 6, 2006, Pages all pages.

Fereday et al., Anhydrous Cobalt (III) Nitrate Chemical Communications, Chemical Communications, 1968, pp. 271.

Fukuzumi, Y. et al., "Liner-Supported Cylinder (LSC) Technology to Realize Ru/Ta2O5/Ru Capacitor for Future DRAMs," IEEE, 2000, IED 2000, Session 34.

Fullerton et al., Advanced Magnetic Recording Media for High-Density Data, Solid State Technology , 2001, vol. 44, Issue i9, pp. 87.

Hones et al., MOCVD of Thin Ruthenium Oxide Films: Properties and Growth Kinetics, Chem. Vap. Deposition , 2000, vol. 6, Issue 4, pp. 193-198.

Hu et al., In Situ Rapid Thermal Oxidation and Reduction of Copper Thin Films and Their Applications in Ultralarge Scale Integration, Journal of the Electrochemical Society, 2001, vol. 148, Issue 12, pp. G669-G675.

Imai, 100 Gbit/Inch HDD Just Around the Corner, Tajuki World Wide Web, nikkeibp.asiabiztech.com/nea/200008/tech_108675.html, Aug. 2000, pp. 1-6.

Inoue et al., Low Thermal-budget Fabrication of Sputtered-PZT Capacitor on Multilevel Interconnects for Embedded FeRAM, IEEE, IED 2000, 2000, vol. Session 34.

Integrated Circuit Engineering Corporation, Practical Integrated Circuit Fabrication Seminar, 1998.

Jung et al., "A Novel Ir/$IrO_2$/Pt-PZT-Pt/$IrO_2$/Ir Capacitor for a Highly Reliable Mega-Scale FRAM" , IEEE, IED 2000, 2000, vol. Session 34.

Kawaguchi, MPEG1 Decoder LSI for Video CD mPD61012NEC Device Technology International, NEC Device Technology International, New Products, Jan. 1998, vol. 5, Issue 48, pp. 4-8.

Kawamoto et al., The Outlook for Semiconductor Processes and Manufacturing Technologies in the 0.1-µm Age, Hitachi Review , 1999, vol. 48, Issue 6, pp. 334-339.

Kwon et al., Plasma-Enhanced Atomic Layer Deposition of Ruthenium Thin Films, Electrochemical and Solid-State Letters, 2004, vol. 4, Issue 7, pp. C46-C48.

Kwon et al., "Ruthenium Bottom Electrode Prepared by Electroplating for a High Density DRAM Capacitor," J. Electrochem. Soc. 151(2): C127-C132 (2004).

Lee et al., Electroless CoWP boosts cooper reliability, device performance, Semiconductor International, Jul. 1, 2004, pp. 5 pages.

NEC Device Technology International, Current State of Leading Edge ULSI Process Technology and Future Trends, 1998, vol. 48, pp. 4-8.

Nilsen et al., Thin Film Deposition of Lanthanum Manganite Perovskite by the ALE process, Journal of Materials Chemistry, 1999, vol. 9, pp. 1781-1784.

Onda et al., Hydrogen Plasma Cleaning a Novel Process for IC-packaging, WWW address: Semiconductor Fabtech.com, 1998, pp. 311.

Pakrad, Pure Tech: Growth of MR/GMR Head Materials, World Wide Web, Puretechinc.com/tech_papers/tech_papers-4.htm, 1999, pp. 1-2.

Paranjpe et al., Atomic Layer Deposition of AIOx for thin Film Head Gap Applications, Journal of Electrochemical Society, V 148 (9), G465-G471.

Parsons et al., "Microcontact Patterning of Ruthenium Gate Electrodes by Selective Area," North Carolina State university, presentation at AVS conference on Atomic Layer Deposition (ALD 2004), Helsinki, Finland, Aug. 16, 2004.

Ritala et al., "Atomic Layer Deposition" , Handbook of Thin Film Materials Deposition and Processing of Thin Films, 2002, vol. 1, Issue Chapter 2, pp. 103-159, San Diego.

Sakurai et al., Adsorption of Ruthenium Tetroxide on Metal Surfaces, J. Phys. Chem American Chemical Society, 1985, vol. 89, pp. 1892-1896.

Satta et al., The Removal of Copper Oxides by Ethyl Alcohol Monitored in Situ by Spectroscopic Ellipsometry, Journal of the Electromechanical Society, 2003, vol. 5, Issue 150, pp. 300-306.

Singer, Progress in Copper: A Look Ahead, Semiconductor International, May 1, 2002.

SOI Technology: IBM's Next Advance in Chip Design, 1998.

Solanki et al., Atomic Layer Deposition of Copper Seed Layers, Electrochemical and Solid-State Letters, 2000, vol. 3, Issue 10, pp. 479-780.

Sundani et al., "Oral Presentation of Dual Damascene Process" [slides], Nov. 19, 1998.

Suntola, Atomic Layer Epitaxy, Handbook of Crystal Growth, 1994, vol. 3, Issue 14, pp. 601-663.

Ueno et al., Cleaning of CHF3 Plasma-Etched SiO2/SiN/Cu via Structures Using a Hydrogen Plasma, an Oxygen Plasma and Hexafluoracetylacetone Vapors , J. Vac. Sci. Technology, 1998, vol. 16, Issue 6, pp. 2986-2995.

Utriainen et al., Studies of Metallic Thin Film Growth in an Atomic Layer Epitaxy Reactor Using $M(acac)_2$ (M=Ni, Cu, Pt) Precursors, Applied Surface Science, 2000, vol. 157, pp. 151-158.

Utriainen et al., Studies of NiO Thin Film Formation by Atomic Layer Epitaxy, Materials Science and Engineering , 1998, vol. B54, pp. 98-103.

Wang, Advanced Materials for Extremely High Density Magnetic Recording Heads, Presentation: Department of Materials Science and Engineering, Department of Electrical Engineering, Stanford University, Stanford, CA 94305-4045, presentation.

Winbond News Release, Successful Development of Capacitor Technology for Next Generation Memory, World Wide Web:winbond.com , Dec. 13, 2000.

Won et al., Conformal CVD-Ruthenium Process for MIM Capacitor in Giga-Bit DRAMs, IEEE, IED, 2000, vol. Session 34.

World Wide web, magahaus.com/tech/westerndigital/shitepapers/gmr_wp.shtml, "GMR Head Technology: Increased Areal Density and Improved Performance Areal Density," pp. 1-4, (Feb. 2000).

World Wide Web: pc.guide.com/ref/hdd/op/heads/techGMR, "Giant Magnetoresistive (GMR) Heads," c.html, 2001, pp. 1-4.

World Wide Web: semiconductor.net/semiconductor/issues/Issues/1998/feb98/docs/e merging.asp, "GMR Read-Write Heads Yield Data Storage Record," Feb. 1998, pp. 1-2.

World Wide Web, stoner.leeds.ac.uk/research/gmr.htm, "Giant Magnetoresistance,", Sep. 9, 2008, pp. 1-8.

Xu et al., "A Breakthrough in Low-k Barrier/Etch Stop Films for Copper Damascene Applications", Semiconductor Fabtech, 2000, vol. 11th edition, pp. 239-244.

Yagishita et al., Cleaning of Copper Surface Using Vapor-Phase Organic Acids, MRS Proceedings, MRS Spring 2003 Meeting, Apr. 21-25, 2003, vol. 766, Symposium E, Issue Session #3, Pages Paper E3.28.

Yoon et al., 197th Meeting Program Information II, The Electrochemical Society, 197th Meeting-Toronto, Ontario, Canada, May 14-18, 2000, Program Information, I1-Rapid Thermal and Other Short-Time Processing Technologies I, Electronics Division/Dielectric Science and Technology Division/High Temperature Materials Division, 2000, Wednesday, May 17, 2000, New Applications of RTP, Co-Chairs: A. Fiory and D.-L Kwong, time 11:10 Abs#550, Title: Development of RTA Process for the Crystallization of a-Si Thin Film-Y.-G. Yoong, T.-K. Kim, K.-B. Kim J.-Y. Chio, B.-I Lee, and S.-K. Joo (Seoul National Univ.).

Yoon et al., "Development of an RTA process for the enhanced crystallization of amorphous silicon thin film," Electrochemical Society Proceedings 2000-9: 337-343 (2000).

Yoon et al., Investigation of $RuO_2$-Incorporated Pt Layer as a Bottom Electrode and Diffusion Barrier for High Epsilon Capacitor Applications, Electrochemical and Solid-State Letters, 2000, vol. 3, Issue 8, pp. 373-376.

Yoon et al., "Tantalum-ruthenium dioxide as a diffusion barrier between Pt bottom electrode and $TiSi2$ ohmic contact layer for high density capacitors," Journal of Applied Physics, Sep. 1, 1999, pp. 2544-2549, vol. 86, No. 5.

Aaltonen et al., "Ruthenium Thin Film Grown by Atomic Layer Deposition," Chem. Vap. Deposition, 9[1], 45, Jan. 2003.

Aoyama, Tomonori., et al., "Ruthenium Films Prepared by Liquid Source Chemical Vapor Deposition Using Bis-(ethylcyclopentadienyl)ruthenium". Jpn. J. Appl. Phys., vol. 38 (1999) pp. L1134-L1136, Aug. 1999.

Hur'Yeva, Tetyana, et al., "Ruthenium Films Deposited by Liquid-Delivery MOCVD using Bis(ethylcyclopentadienyl)ruthenium with Toulene as the Solvent". Chemical Vapor Deposition 2006, 12, pp. 429-434, Jul. 2006.

Kadota, Takumi et al., "Ruthenium Films Deposited under H2 by MOCVD using a Novel Liquid Precursor". IEEE Article, pp. 175-176, no date available, Jan. 2009.

Onda et al., "DC-Hydrogen Plasma Cleaning a Novel Process for IC-Packaging", SEMICON West 97, Packagin Materials Conference, 1997, pp. D-1-D10, Jul. 1997.

Park et al., "Metallorganic Chemical Vapor Deposition of Ru and $RuO_2$ using Ruthenocene Precursor and Oxygen Gas," J.Electrochem. Soc., 147[1], 203, Jan. 2000.

Tung et al., Atomic Layer Deposition of Noble Metals: Exploration of the low limit of the deposition temperature, J. Mater. Res., vol. 19, No. 11, p. 3353-3357 (Nov. 2004).

* cited by examiner

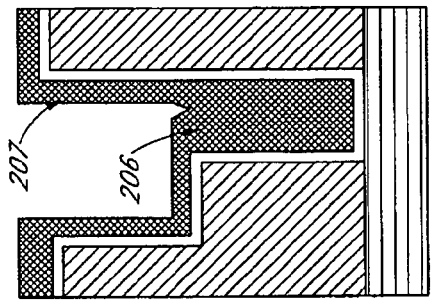
FIG. 6A
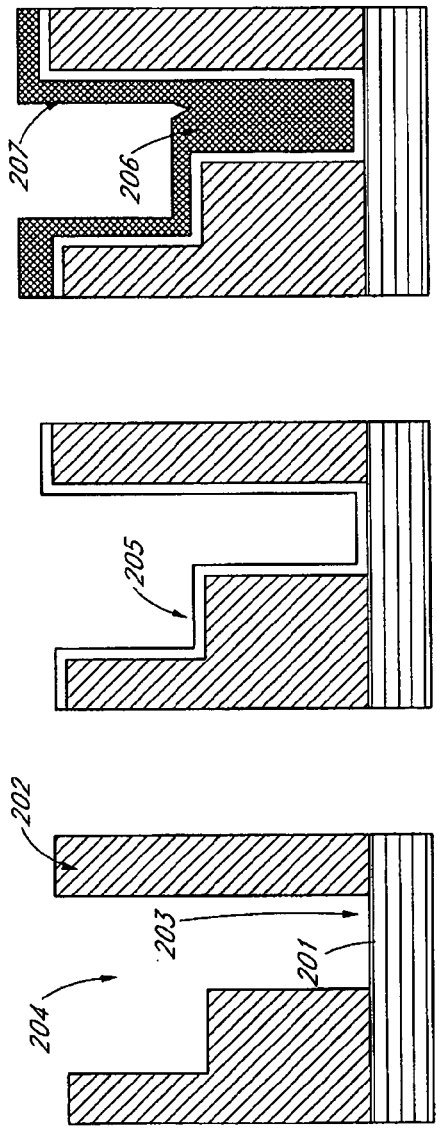
FIG. 6B
FIG. 6C
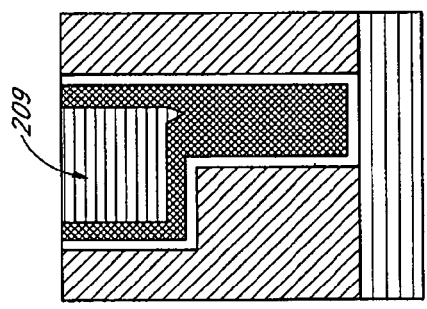
FIG. 6D
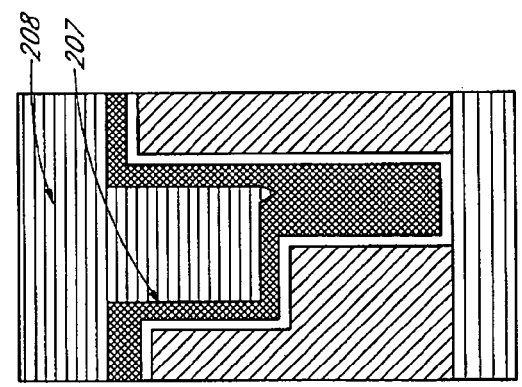
FIG. 6E

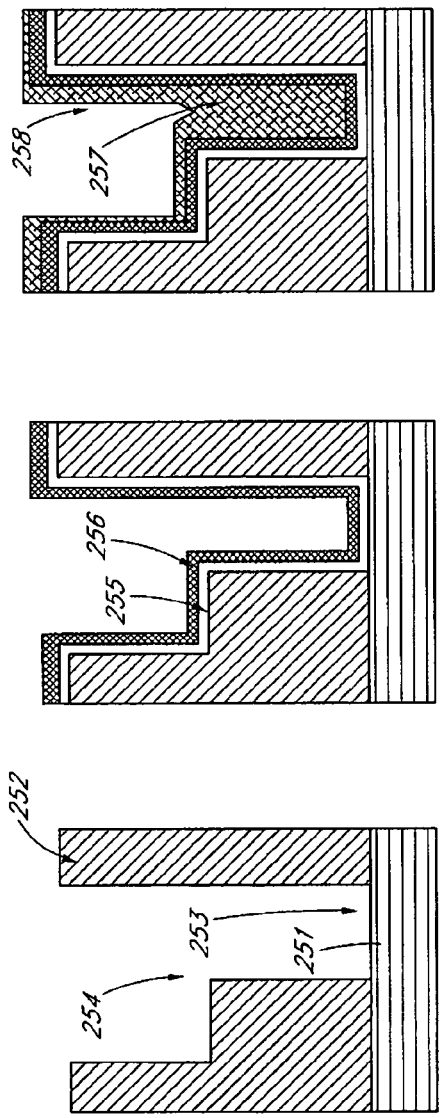
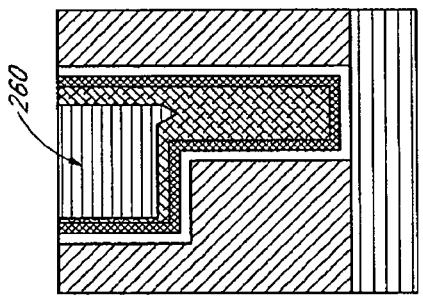
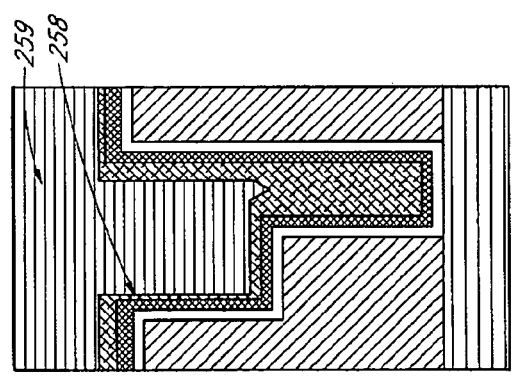
FIG. 10A    FIG. 10B    FIG. 10C    FIG. 10D    FIG. 10E

RUTHENIUM ALLOY FILM FOR COPPER INTERCONNECTS

CROSS-REFERENCE TO RELATED APPLICATIONS

This application claims the benefit of U.S. Provisional Application No. 61/029,851, filed Feb. 19, 2008, the disclosure of which is herein incorporated by reference in its entirety.

BACKGROUND OF THE INVENTION

1. Field of the Invention

The present invention generally relates to formation of copper interconnects or copper wiring filled grooves such as contact holes or via holes, which is suitable for manufacturing fine structure semiconductor devices.

2. Description of the Related Art

In next-generation wiring structures, contact holes that connect diffusion layers and wiring layers on a silicon substrate, and via holes that connect metal wirings, are connection holes for connecting wirings. As semiconductor devices become increasingly finer, aspect ratios of these connection holes are also increasing and concerns are raised over the rise in contact resistance and via resistance. As for contact resistance, tungsten-filled structures have been traditionally used. To address fine contact holes, a method to form a Ti/TiN CVD film and then fill the holes with a W film using CVD has been used. However, the high resistivity of this W film causes the W plug resistance to increase when the contact hole diameter becomes 50 nm—a size required of devices at the 32-nm technology node generation and beyond, and the aspect ratio reaches 5 or more. The higher W plug resistance can inhibit device performance (V. Arnal, A. Farcy, M.Aimadeddine, V. Jousseaume, L. G. Gosset, J. Guillan, M. Assous, L. Favennec, A. Zenasni, T. David, K.Hamioud, L-L. Chapelon, N. Jourdan, T. Vanypre, T. Mourier, P. Chausse, S. Maitrejean, C. Guedj, J. Torres, "Materials and processes for high signal propagation performance and reliable 32 nm node BEOL", pp.1-3, International Interconnect Technology Conference, IEEE (2007)).

For this reason, use of copper, Rh or other low-resistance material to fill contact holes is proposed (Shao et al., Proceedings of IITC 2007, pp. 102-104). If a Cu contact plug is used, a copper-diffusion barrier film is needed to prevent diffusion of Cu into the diffusion layer, and a seed layer must also be formed that can form copper in a manner achieving good adhesion while offering good coatability to ensure favorable filling property. Methods to fill contact holes include one that uses plating and another that uses chemical vapor deposition. Under the plating method, a seed layer having favorable coatability is required, along with deposition of an atomic layer to form this seed layer, or a Cu seed layer or connection seed layer constituted by Ru, etc., formed by chemical vapor deposition. On the other hand, another method is reported whereby contact holes are filled with copper by means of chemical vapor deposition using an underlayer constituted by a Ru or other film that allows for easy formation of a core to achieve chemical vapor deposition of copper.

It is becoming increasingly difficult to form a Cu-diffusion barrier layer or Cu seed layer over via holes of high aspect ratios using the conventional PVD. Particularly with a Cu-diffusion barrier film by PVD, forming a thin, continuous Cu-diffusion barrier film is difficult on the side face at the bottom of the via hole, and therefore formation of such film using a method that can achieve favorable coatability is desired. Similarly when a Cu seed layer is formed over via holes of high aspect ratios using the conventional PVD, the Cu film tends to agglomerate on the side face at the bottom of the contact or via hole, and the film tends to become discontinuous as a result. Accordingly, a method to form RuTa alloy beforehand to facilitate formation of PVD-Cu is suggested, as proposed in US2007/0059502 A1. In this case, RuTa alloy with a Ru composition ratio of 80% or more is formed as the underlayer for Cu seed layer to form a continuous Cu film as a Cu seed film. However, although introduction of Ru certainly improves the morphology of the PVD-Cu film, forming a Cu film with good coatability through PVD-Cu is also becoming difficult as the trend for finer via holes accelerates.

Accordingly, a method is proposed whereby, instead of forming a Cu film by PVD, a film constituted by Ru, for example, is formed and after a Ru film has been formed, the Ru film is used as a seed layer for Cu electrolytic plating without forming a Cu seed layer ("PEALD of Ru layers on WNC ALD barrier for Cu/porous low-k integration," Proceedings of Advanced Metallization Conference 2006, p. 39). In this case, the Ru film can be formed by CVD, ALD or other method capable of achieving good coatability, which solves the coatability problem presented by PVD. On the other hand, the Ru film thickness must be increased to at least approx. 5 to 10 nm to form a seed layer whose resistance is low enough to support electrolytic plating. Considering that next-generation Cu wirings require via holes of approx. 30 nm in size, therefore, 10 to 20 nm of the 30-nm hole will be occupied by a Ru film. On the other hand, the resistivity of Ru film is one digit higher than that of Cu film, which leads to higher via resistance and contact resistance.

If a thin Ru film can be formed, it is possible to form a Cu seed film by CVD (chemical vapor deposition) or ALD after forming a thin Ru film. To achieve a continuous Cu seed film, however, the film thickness must be at least 5 to 10 nm. Let's assume that the via hole size is 30 nm and a Cu barrier film is formed by 2 nm below a Ru film. Even if the Ru film is as thin as 2 nm, the Cu seed film is at least 5 nm thick and therefore the total thickness becomes 9 nm. As a result, 18 nm of the via hole diameter of 30 nm will be occupied by the Cu barrier film, Ru film and Cu seed film. In electrolytic plating where the via hole height is 200 nm, therefore, the aspect ratio will become 200 nm/12 nm=16. This aspect ratio is extremely tight for electroplating, even with electrolytic plating. Resolving this problem in the real world using existing electrolytic plating technology is extremely difficult.

In light of the above, forming Cu wirings in connection holes using the conventional PVD alone is becoming increasingly difficult in the formation of next-generation Cu wirings involving higher aspect ratios. Also, application of a Ru-type film presents the problem of increasing wiring resistance in connection holes. Furthermore, if a thin Ru-type film is applied, the aspect ratio of connection holes becomes too high for electrolytic plating. If a thin Ru-type film is applied and connection holes are filled by a Cu film by means of chemical vapor deposition, seams and voids tend to occur.

The above mainly described the formation of Cu plugs in contact holes, but next-generation semiconductor devices require new technology to fill Cu not only in connection holes provided in diffusion layers on a silicon substrate, but also in connection holes of high aspect ratios of around 5 to 15 used to connect the W wirings in the lower layer and Cu wirings in the upper layer. With respect to such technology, the Cu volume must be increased as much as possible if a thin Cu barrier film is to be formed in a connection hole of a high aspect ratio to fill the hole while reducing the via resistance at the same time. For this reason, a very thin film offering good coatability and excellent adhesion with Cu must be formed as a Cu barrier seed.

SUMMARY OF THE INVENTION

To fill connection holes such as contact holes and via holes with Cu, a seed layer having excellent adhesion with Cu film is needed. If a copper plug is used, either with contact holes or via holes, it is also necessary to prevent diffusion of copper. Accordingly, use of a laminate comprising a copper-diffusion barrier layer and a seed layer offering good adhesion with copper as an underlayer is effective in the formation of a copper contact plug. If the deposition speed of Cu film is the same at the bottom and side face of the contact hole, however, it is desired that the contact hole has a shape having a wider opening and tapered toward the bottom. If the contact hole diameter is the same between the opening and bottom, filling such contact hole becomes extremely difficult, and voids called "seams" are formed in the contact plug. The same goes with via plugs. Accordingly, ideally fine contact holes and via holes have a tapered shape if they are to be filled with copper by means of chemical vapor deposition. However, the needs for finer and more integrated structures limit how much the holes can be tapered. Accordingly, new technology to fill these holes without generating seams and voids is needed.

In an embodiment where one or more of the above problems can be resolved, an aspect of the present invention provides a method for forming interconnect wiring, comprising: (i) covering a surface of a connection hole penetrating through interconnect dielectric layers formed on a substrate for interconnect wiring, with an underlying alloy layer selected from the group consisting of an alloy film containing ruthenium (Ru) and at least one other metal atom (M), a nitride film thereof, a carbide film thereof, and an nitride-carbide film thereof, and (ii) filling copper or a copper compound into the connection hole covered with the underlying alloy layer.

The above embodiment may further include the following embodiments in any combination:

In an embodiment, the method may further comprise covering a surface of the connection hole with a copper diffusion barrier layer prior to step (i). The barrier layer may be a film constituted by a material selected from the group consisting of TaN, Ta, TaNC, TaSiN, TiN, Ti, TiNC, and TiSiN in an embodiment. Alternatively, the barrier layer may further include Ru and may be a film constituted by a material selected from the group consisting of RuTaN, RuTaNC, RuTiN, RuTiNC, RuN, and RuNC.

In any one of the foregoing embodiments, in step (i), the underlying alloy layer may be formed as a copper diffusion barrier layer, and in step (ii), the copper or the copper compound may be filled by CVD. In the above, a wiring groove communicating with the interconnection hole may further be formed above the interconnection hole in the interconnect dielectric layers in a dual damascene arrangement, and in step (i), a surface of the wiring groove may also be covered with the underlying alloy layer. In an embodiment, in step (ii), the copper or the copper compound may be filled into the interconnection hole substantially or nearly in its entirety.

In any one of the foregoing embodiments, the method may further comprise filling copper by electrolytic plating into the remaining part of the interconnection hole which is not filled with the copper or the copper compound by CVD in step (ii), wherein a layer formed by CVD in step (ii) is used as a copper seed layer. In an embodiment, the method may further comprise filling copper by electrolytic plating into the remaining part of the interconnection hole which is not filled with the copper or the copper compound by CVD in step (ii) and the wiring groove, wherein a layer formed by CVD in step (ii) is used as a copper seed layer.

In any one of the foregoing embodiments, the underlying alloy layer may be a laminate comprised of the nitride film or the nitride-carbide film as a first layer and the carbide film as a second layer. In an embodiment, step (i) may comprise controlling supply of a Ru precursor and supply of an M precursor to adjust an atomic ratio of Ru/(Ru+M) of the underlying layer at 0.6 to 0.9 (in another embodiment, 0.75 to 0.85) for the first layer and then at 0.7 to 0.95 (in another embodiment, 0.6 to 0.9) for the second layer. In an embodiment, the first layer may be formed using a hydrogen-nitrogen plasma whereas the second layer may be formed using a hydrogen plasma.

In any one of the foregoing embodiments, step (i) may comprise controlling supply of a Ru precursor and supply of an M precursor to adjust an atomic ratio of Ru/(Ru+M) of the underlying alloy layer preferably at about 0.6 to about 0.9 (in another embodiment, about 0.75 to about 0.85). In an embodiment, step (i) may comprise forming the underlying alloy layer by atomic layer deposition. In an embodiment, step (i) may comprise supplying a Ru precursor and an M precursor alternately in cycles to form the underlying alloy layer. In an embodiment, the Ru precursor may be supplied in one or more pulses and the M precursor may be supplied in one or more pulses in one cycle. In an embodiment, step (i) may comprise adjusting the number of pulses of the Ru precursor supply and the number of pluses of the M precursor supply to adjust the atomic ratio of Ru/(Ru+M) of the underlying alloy layer. In an embodiment, step (i) may comprise: (I) conducting atomic deposition of M X times, each atomic deposition of M comprising supplying the M precursor and supplying a gas chemically reactive to the M precursor; (II) after step (I), conducting atomic deposition of Ru Y times, each atomic deposition of Ru comprising supplying the Ru precursor and supplying a reduction gas, wherein X<Y; and (III) repeating steps (I) and (II) Z times, thereby forming a M–Ru alloy layer as the underlying alloy layer. In an embodiment, step (II) may comprise applying radio-frequency power to the reduction gas to generate a plasma of the reduction gas. In an embodiment, the reduction gas may be hydrogen gas or a mixed gas of hydrogen gas and nitrogen gas In an embodiment, step (II) may comprise applying negative potential to a heating support on which the substrate is placed. In an embodiment, Z is 50-100, resulting in a Ru-M alloy film having a thickness of 1-2 nm.

In any one of the foregoing embodiments, a proportion of Ru in the underlying alloy layer at a bottom of the connection hole may be higher than that at a side wall of the connection hole or at an upper surface of the substrate. In an embodiment, the underlying alloy layer at the bottom may contain less C and/or N than at the side wall or the upper surface. In an embodiment, the proportion of Ru may be adjusted by applying bias voltage to the substrate.

In the above, the atomic layer deposition (ALD) may be of any type such as thermal or plasma ALD. In the plasma ALD, bias voltage can easily be controlled and applied to the substrate.

In any one of the foregoing embodiments, the M may be Ti or Ta. In any one of the foregoing embodiments, the Ru precursor may be a β-diketone-coordinated ruthenium compound.

In any one of the foregoing embodiment, step (ii) may preferably comprise depositing Cu by CVD.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

BRIEF DESCRIPTION OF THE DRAWINGS

These and other features of this invention will now be described with reference to the drawings of preferred embodiments which are intended to illustrate and not to limit the invention. The drawings are oversimplified for illustrative purposes and are not to scale.

FIGS. 6(a) to 6(e) are schematic cross sections of a partially fabricated integrated circuit, showing Cu filling processes in a contact hole according to an embodiment of the present invention.

FIGS. 10(a) to 10(e) are schematic cross sections of a partially fabricated integrated circuit, showing Cu filling processes in a contact hole according to an embodiment of the present invention.

DESCRIPTION OF THE SYMBOLS

Figure 1C:
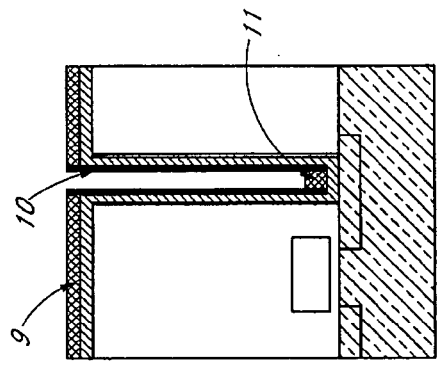
FIGS. 1(a) to 1(f) are schematic cross sections of a partially fabricated integrated circuit, showing Cu filling processes in a contact hole according to an embodiment of the present invention.
Figure 1F:
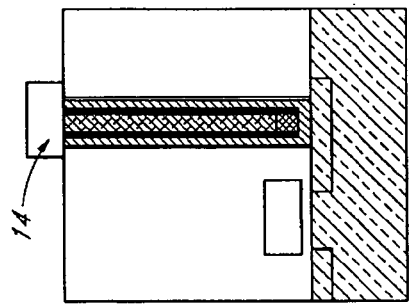
Figure 1B:
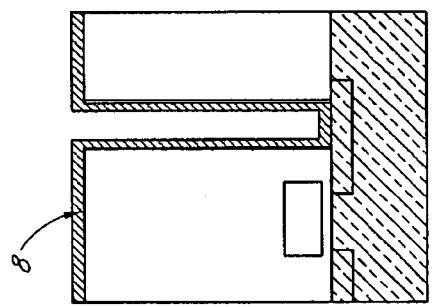

1: Silicon substrate
2: Transistor diffusion layer (source)
3: Transistor diffusion layer (drain)
4: Gate insulation film
5: Transistor gate electrode wiring
6: Interlayer insulation film
7: Contact hole for forming transistor contact electrode
8: Ta or Ti-type barrier metal
9: TaRu alloy or TiRu alloy formed in a flat area on the upper face of an interlayer insulation film
10: TaRu alloy or TiRu alloy formed on the inner surface of a contact hole
11: TaRu alloy or TiRu alloy formed on the bottom face of a contact hole
12: Cu-CVD film formed in a contact hole by chemical vapor deposition
13: Cu contact plug formed in a contact hole
14: Wiring in a Cu contact plug
101: Interlayer insulation film
102: Lower-layer wiring
103: Interlayer insulation film
104: Connection hole
105: Cu barrier metal layer
106: Alloy layer constituted by Ta and Ru
107: Cu film (initial deposition stage)
108: Cu film (intermediate deposition stage)
109: Cu film filling a connection hole
301: Silicon substrate
302: Transistor diffusion layer (source)
303: Transistor diffusion layer (drain)
304: Gate insulation film
305: Transistor gate electrode wiring
306: Interlayer insulation film
307: Contact hole for forming transistor contact electrode
308: Ta or Ti-type barrier metal
309: TaRu alloy or TiRu alloy formed in a flat area on the upper face of an interlayer insulation film
310: TaRu alloy or TiRu alloy formed on the inner surface of a contact hole
311: TaRu alloy or TiRu alloy formed on the bottom face of a contact hole
312: Cu-CVD film formed in a contact hole by chemical vapor deposition
313: Cu contact plug formed in a contact hole
314: Wiring in a Cu contact plug
331: N2 MFC
332: N2 introduction valve
201: Cu wiring
202: Interlayer insulation film
203: Via hole area of Cu wiring
204: Cu wiring area
205: RuTa alloy film to be used as a Cu-diffusion barrier layer 206: Cu plug
207: Cu seed layer
208: Cu plating layer
209: Cu wiring by CMP flattening
251: Cu wiring
252: Interlayer insulation film
253: Via hole area of Cu wiring
254: Cu wiring area
255: RuTa nitride-carbide film to be used as a Cu-diffusion barrier layer
256: RuTa carbide film
257: Cu plug
258: Cu seed layer
259: Cu plating layer
260: Cu wiring by CMP flattening Detailed Description of the Preferred Embodiment The present invention will be explained in detail with reference to preferred embodiment. However, the preferred embodiments are not intended to limit the present invention.

The process leading to the present invention does not limit the present invention in any way. However, the inventors focused on a Cu film formed by chemical vapor deposition, instead of conventional plating, as a way to fill fine via holes and contact holes using this Cu film. In the case of electrolytic plating, a Cu seed layer or Ru seed layer needs to be formed beforehand because a low-resistance seed layer is required. In the case of chemical vapor deposition, on the other hand, there is no need for low-resistance seed layer and only a very thin underlayer will suffice. This means that the Cu volume can be increased as long as the holes can be filled with Cu formed by chemical vapor deposition, and thus the via resistance and contract resistance can be reduced. The problem lies in the formation of this underlayer. For a Cu underlayer, use of a Cu-diffusion barrier metal film to prevent diffusion of Cu is a must. Accordingly, if this Cu-diffusion barrier metal film provides a good underlayer for forming a Cu film by chemical vapor deposition, then the film can serve as both a Cu-diffusion barrier and a seed layer, which makes the process very advantageous.

Now, what it means by "good underlayer" is explained. In chemical vapor deposition, organic material reacts with Cu at the underlayer surface and forms a Cu core. The higher the density of the core, the higher the chances that a thinner, continuous Cu film is formed. Breakdown of Cu material is sensitive to the material and surface condition of the lower layer, and therefore selecting a good material is essential.

After many years of research into this underlayer material, the inventors confirmed that, when forming a Cu film by CVD using (trimethylvinylsilyl)hexafluoroacetylacetonato copper, for example, breakdown of Cu material and formation of core occur easily on a metal film containing Ru. The core grows easily regardless of the Ru composition and without an incubation period for Cu film to grow. For example, Ta—Ru nitride, carbide and nitride-carbide alloy to which Ru atoms have been added, and Ti—Ru nitride, carbide and nitride-carbide alloy, are good candidates for the underlayer material.

On the other hand, the inventors also found that when a Cu-CVD film was formed in a connection hole by, for example, using a Ta—Ru nitride, carbide or nitride-carbide alloy with a modified composition, then the filling characteristics of Cu film would change significantly depending on the composition of the Ru—Ta alloy constituting the underlayer. In an embodiment, seams and voids did not generate and filling was possible under Cu-CVD when the Ru—Ta composition in the film, or Ru/(Ru+Ta), was approx. 60 to 90%.

On the other hand, it was found that voids would generate when Ta was 40% or more, while seams would generate easily when Ru was 90% or more. In other words, the inventors discovered an amazing phenomenon that by optimizing the atomic composition of RuTa alloy, a Cu film formed by Cu-CVD would deposit in a manner filling fine via holes and contact holes. Using this method, RuTa alloy controlled at an optimal composition can form a Cu film by CVD while achieving favorable filling results, even when the film thickness is very small, say, approx. 1 to 3 nm. As a result, low-resistance via holes and contact holes can be formed. The inventors also examined whether films formed this way could be applied as Cu-diffusion barrier films. After examining the forming method and Cu-diffusion barrier property of RuTa alloy, the inventors found that favorable Cu barrier property could be achieved by forming a RuTa nitride or carbide-nitride film. In an embodiment, favorable Cu barrier property was confirmed as a result of introducing nitrogen atoms by 15 to 30%, or preferably by 20 to 25%. Also, these films not only serve as an underlayer for Cu deposition, but they also serve as a Cu-diffusion barrier. Accordingly, a simpler, more cost-effective process can be achieved.

In an embodiment, therefore, filling can be achieved with a Cu film formed by chemical vapor deposition and Cu barrier property can also be ensured when Ru/(Ru+Ta) is 0.6 to 0.9 and the atomic ratio of N is 20 to 25%. It has been confirmed that the aforementioned object can be achieved when these conditions are satisfied. In an embodiment where an organic metal material is used, the same characteristics can be achieved even when the carbon content in the film is 5to 15%.

In an embodiment, another effective method is presented for achieving both barrier property and CVD-Cu filling property, which is to use a RuTa alloy containing nitrogen as mentioned above to form a Cu barrier layer, and layer it with another RuTa alloy not containing nitrogen and whose RuTa composition has been controlled to a condition that allows for easy formation of a CVD-Cu film. In this case, a Cu film can be formed by chemical vapor deposition to fill fine via holes by controlling the Ru/(Ru+Ta) composition ratio in the RuTa carbide to, say, 70 to 95%.

As explained above, in an embodiment of the present invention the technical problems can be resolved by implementing a filling process using a Cu film formed by chemical vapor deposition on a single underlayer constituted by Ru, Ta, N and C, instead of using the conventional method of forming a Cu seed on a RuTa alloy to provide Cu plating, or the method of forming a Cu seed on a Ru film to provide Cu plating, or even the method of directly plating Cu on a Ru film.

In an embodiment, a Cu film can be formed on a single-layer RuTaNC film by chemical vapor deposition by controlling the Ru/(Ru+Ta) ratio within a range of 60 to 90%. In an embodiment where a RuTaC film is layered with a RuTaNC film provided as a barrier film, on the other hand, fine via holes can be filled in a favorable manner by controlling the Ru/(Ru+Ta) ratio in the RuTaC film within a range of 70 to 95%. These RuTaNC film and RuTaC film can be formed successively using the same process apparatus, and they can be effectively included in a single RuTa alloy forming process.

The above presented a process of forming a Cu film by chemical vapor deposition on a nitride film, carbide-nitride film or carbide film constituted by an alloy of Ru and Ta, and then filling wiring connection holes or fine via holes. Even when via holes for dual damascene wiring are filled with copper, in the wiring area a copper film formed by chemical vapor deposition can be used as a seed layer for electrolytic plating. From industrial viewpoints, this is advantageous because the electrolytic plating cost is low and existing manufacturing apparatuses can be used. Of course, if this copper film by chemical vapor deposition is not used to fill via holes, the film functions as a seed layer, in which case both via holes and wiring layers can be filled with copper by means of electrolytic plating just like in normal dual damascene wiring processes.

The aforementioned ranges vary depending on the copper filling method (plasma ALD, thermal ALD, etc.), copper material, aspect ratio of the connection hole, types of metal atoms other than Ru (Ta, Ti and other metals not having ideal adhesion with copper), and so on. In another embodiment, for example, filling by Cu-CVD is possible without generating seams and voids in a Ru range of approx. 40 to 80%.

In this range of Ru—Ta composition ratios, it is considered that Cu grows more slowly on the side face of the connection hole compared to the speed at which it grows on the bottom face of the hole. Since the film quality of a Ru—Ta alloy film has strong dependence on the plasma processing conditions, the film quality on the side face can also be controlled by applying bias voltage to the substrate, for example. Accordingly, one reason why Cu deposition is suppressed on the side face is estimated to be a larger amount of C and N atoms mixing on the side face. In this case, Cu filling characteristics can be improved by adjusting the Ru/(Ru+Ta+N+C) ratio to 50% or less on the side face, when the same ratio is approx. 50 to 80% (or 60 to 70% in an embodiment) at the bottom of the via hole. For your information, the Ru/(Ta+Ru) ratio does not seem to change much between the bottom face and side face. It is estimated that the main difference is the atomic composition of N and C, where there are more N and C on the side face than the bottom face. This is probably because plasma exerts stronger action on surfaces parallel with the substrate. In other words, it is estimated that by applying bias voltage, the plasma effect on the bottom face increases and mainly the carbon and nitride composition ratios decrease, and as a result the Ru composition ratio relative to all elements generally increases.

It is believed that if bias voltage, etc., is not applied, then C and N contents should not be different between the bottom face and side face. In the case of atomic layer deposition using plasma, however, the effect of self-bias voltage leads to a difference between the side face and bottom face in how ions carried by plasma contact them. As a result, self-bias voltage is generated in the grounded substrate even when bias voltage is not applied to the substrate, and this causes differences in N and C contents. Still, the present invention is not limited in any way by any of the above theories and estimations.

In the case of atomic layer deposition, the Ru/(Ta+Ru) ratio can be adjusted by the ratio of pulses at which material gases are introduced. Basically the same argument provided above also applies to the optimal Ru/(Ta+Ru) atomic ratio in atomic layer deposition where plasma is not used.

The present invention includes the above mentioned embodiments and other various embodiments including the following:

1) A Cu wiring and method for forming wiring, characterized in that in a connection hole formed in a manner penetrating through an interlayer insulation film to connect wirings formed on a silicon substrate, an alloy film containing at least one type of metal atom and Ru or a nitride film, carbide film or nitride-carbide film of the alloy is formed, after which a Cu film is formed to fill the connection hole.

2) A Cu wiring for connecting wires and method for forming wiring, characterized in that in a connection hole formed in a manner penetrating through an interlayer insulation film to connect wirings formed on a silicon substrate, an alloy film containing at least one type of metal atom and Ru or a nitride film, carbide film or nitride-carbide film of the alloy is formed on a first metal film to be used as a Cu-diffusion barrier, after which a Cu film is formed to fill the connection hole.

3) A Cu wiring and method for forming wiring according to 1) or 2) above, characterized in that the Ru composition ratio in the alloy film containing at least one type of metal atom and Ru or a nitride film, carbide film or nitride-carbide film of the alloy on the side face of the connection hole is smaller than the composition ratio on the bottom face of a contact hole or flat area of the substrate.

4) A Cu wiring and method for forming wiring according to 1) or 2) above, characterized in that the composition ratio of the metal atom in the alloy film containing at least one type of metal atom and Ru or a nitride film, carbide film or nitride-carbide film of the alloy on the side face of the connection hole is greater than the composition ratio on the bottom face of a contact hole or flat area of the substrate.

5) A Cu wiring and method for forming wiring according to any one of 1) to 4) above, characterized in that the alloy film containing at least one type of metal atom and Ru or a nitride film, carbide film or nitride-carbide film of the alloy is formed by atomic layer deposition, comprising: repeating Z times the first process where a step to supply a material gas containing the first metal atom, and a step to supply a reactant gas that chemically reacts with the material containing the first metal atom, are repeated X times and the second process where a step to supply a material gas containing Ru, and a step to supply a reducing gas, are repeated Y times.

In the above, any repeating processes disclosed in U.S. patent application Ser. No. 11/955,275, which is owned by the same assignee as in the present application, can be used in embodiments of the present invention (the disclosure of the cyclical processes taught in the above applications is herein incorporated by reference in their entirety).

6) A Cu wiring and method for forming wiring according to 5) above, characterized in that in the step to supply a material gas containing Ru and step to supply a reducing gas, the reducing gas is activated by applying high-frequency plasma.

7) A Cu wiring and method for forming wiring according to 6) above, characterized in that when high-frequency plasma is applied to the reducing gas, negative voltage is applied to a heating table on which the substrate having the contact hole is placed.

8) A Cu wiring and method for forming wiring according to any one of 1) to 7) above, characterized in that the reducing gas is hydrogen.

9) A Cu wiring and method for forming wiring according to any one of 1) to 7) above, characterized in that the reducing gas is a mixed gas of nitrogen and hydrogen.

10) A Cu wiring and method for forming wiring according to any one of 1) to 9) above, characterized in that the first metal is Ta or Ti.

11) A Cu wiring and method for forming wiring according to any one of 1) to 10) above, characterized in that the Cu film is formed by chemical vapor deposition.

12) A Cu wiring and method for forming wiring according to 11) above, characterized in that (trimethylvinylsilyl) hexafluoroacetylacetonato copper is used as the Cu material applied in the chemical vapor deposition of the Cu film.

13) A Cu wiring and method for forming wiring according to any one of 1) to 12) above, characterized in that the Cu film is formed by plating.

14) A Cu wiring and method for forming wiring according to any one of 1) to 13) above, characterized in that the metal atom is Ta and the material vapor containing Ta atoms is at least one selected from TAIMATA (Tertiaryamylimidotris (dimethylamido)tantalum), TBTDET (Ta(N-i-C4H9)[N(C2H5)2]3) and PDMAT (Ta[N(CH3)2]5), among others.

15) A Cu wiring and method for forming wiring according to any one of 1) to 13) above, characterized in that the metal atom is Ti and the material vapor containing Ti atoms is at least one selected from Tetrakisdiethylaminotitanium and Tetrakisdimethylaminotitanium, among others.

With respect to adhesion with Cu, TiN has poor adhesion with Cu. Accordingly adding Ru improves the adhesion with Cu. For your information, improvement can also be expected from adding Ru to metal atoms having poor adhesion with Cu, other than Ta and Ti.

16) A Cu wiring and method for forming wiring according to any one of 1) to 15) above, characterized in that the material vapor containing Ru atoms contains two ligands constituted by β-diketone groups.

17) A Cu wiring and method for forming wiring according to any one of 1) to 15) above, characterized in that the material vapor containing Ru atoms is a ruthenium complex containing cyclic dienyl or non-cyclic dienyl.

In the above, the material containing Ru atoms is expressed by the formulas below, for example:

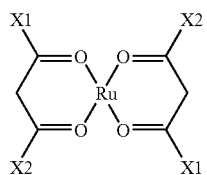

(1)

wherein X1 and X2 are each independently CH3, C(CH3)3, CH(CH3)2, or CH2(CH3).

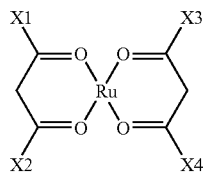

(2)

Wherein X1 to X4 are each independently CH3, C(CH3)3, CH(CH3)2, or CH2(CH3), with a proviso that if X1 and X4 are the same, X2 and X3 are different.

In addition to the above, any Ru-containing compounds disclosed in U.S. patent application Ser. Nos. 11/469,828 and 11/557,891 and U.S. Provisional Application No. 60/976,378, all of which are owned by the same assignee as in the present application, can be used in embodiments (the disclosure of the Ru-containing precursor compounds taught in the above applications is herein incorporated by reference in their entirety).

18) A Cu wiring and method for forming wiring according to any one of 1) to 15) above, characterized in that the aspect ratio of the connection hole is 2 or more, or in an embodiment 5 or more (such as 5 to 15).

19) A method for forming metal wiring characterized by comprising: a step to form in an interlayer insulation film formed by covering the lower-layer conductive layer formed on a silicone substrate a connection hole connecting to the lower-layer conductive layer providing a wiring pattern, or both a connection hole connecting to the lower-layer conductive layer and a wiring groove connecting to this connection hole; a step to form an alloy film constituted by Ru and Ta, or by Ru and Ti, to be used as a copper-diffusion barrier; and a step to implement chemical vapor deposition using a copper or copper compound to fill the connection hole connecting to the lower-layer conductive layer, or both the connection hole connecting to the lower-layer conductive layer and wiring groove connecting to this connection hole, at least partially using the copper or copper compound.

20) A method for forming metal wiring according to 19) above, characterized by comprising, after the steps described in 19) above, a step to further form copper by means of electrolytic plating by using, as a seed layer for electrolytic plating, the copper or copper compound film formed by chemical vapor deposition, in order to fill the connection hole connecting to the lower-layer conductive layer, or both the connection hole connecting to the lower-layer conductive layer and wiring groove connecting to this connection hole, using the copper or copper compound.

21) A method for forming copper wiring according to 19) or 20) above, characterized in that the alloy film constituted by Ru and Ta, or by Ru and Ti, to be used as a copper-diffusion barrier is a nitride film, carbide film or carbide-nitride film.

22) A method for forming copper wiring according to 19) or 20) above, characterized in that the alloy film constituted by Ru and Ta, or by Ru and Ti, to be used as a copper-diffusion barrier is a laminate film comprising a nitride film or carbide-nitride film and a carbide film of Ru and Ta or Ru and Ti or Ru film.

23) A method for forming copper wiring according to 22) above, characterized in that the alloy film constituted by Ru and Ta, or by Ru and Ti, to be used as a copper-diffusion barrier has a Ru/(Ru+Ta) composition ratio or Ru/(Ru+Ti) composition ratio of 60 to 90%.

24) A method for forming copper wiring according to 22) above, characterized in that the carbide film constituting the alloy film of Ru and Ta or Ru and Ti has a Ru/(Ru+Ta) composition ratio or Ru/(Ru+Ti) composition ratio of 70 to 95%.

25) A method for forming copper wiring according to 22) above, characterized in that the Ru film has a Ru composition ratio of 90% or more.

26) A method for forming copper wiring according to any one of 19) to 21) above, characterized in that a metal film to be used as a copper-diffusion barrier is formed in the lower layer of the alloy film constituted by Ru and Ta, or by Ru and Ti, to be used as a copper-diffusion barrier.

27) A method for forming copper wiring according to 26) above, characterized in that the metal film to be used as a copper-diffusion barrier is TiN, Ti, TaN, Ta, TiSiN, TaSiN, TiNC or TiNC.

28) A method for forming copper wiring according to 26) above, characterized in that the metal film to be used as a copper-diffusion barrier contains Ru.

29) A method for forming copper wiring according to 28) above, characterized in that the metal film to be used as a copper-diffusion barrier is constituted by RuTaN, RuTiN, RuN, RuTaNC, RuTiNC or RuNC.

30) A method for forming copper wiring according to any one of 19) to 26) above, characterized by comprising: a step to supply Ta material or Ti material for the alloy film constituted by Ru and Ta, or by Ru and Ti, to be used as a copper-diffusion barrier; a step to discharge the Ta material or Ti material; a step to implement plasma using a reducing gas containing H2 or gas containing H2/N2; a step to supply Ru material; a step to discharge the Ru material; and a step to apply plasma using He or a gas containing H2/N2.

The detailed explanations of favorable embodiments provided below should reveal specific modes for carrying out the present invention.

As an embodiment of the present invention, an example of a Cu wiring structure and method for forming such structure, as shown in FIG. 1, is explained. FIG. 1(a) shows a contact hole 7 formed in a manner penetrating through an interlayer insulation film 6 to connect diffusion layers 2, 3 on a silicon substrate 1 and wiring layers on the substrate. In FIG. 1(b), a Cu-diffusion barrier metal 8 (examples of the Cu barrier metal film shown in FIG. 1 include Ta, TaN, TaNC, Ti, TiN and TiNC, among others). In FIG. 1(c), an alloy film 9 in a flat area on the top face of the contact hole, an alloy film 10 on the side face of the contact hole, and an alloy film 11 at the bottom of the contact hole, are further formed (using, for example, thermal or plasma atomic layer deposition), where all alloy films contain at least one type of metal atom and Ru.

Figure 1E:
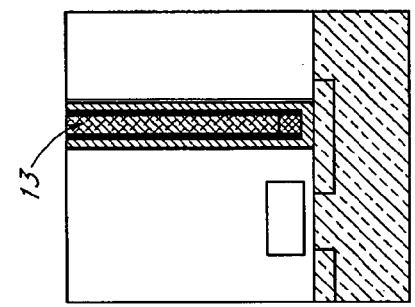
Figure 1A:
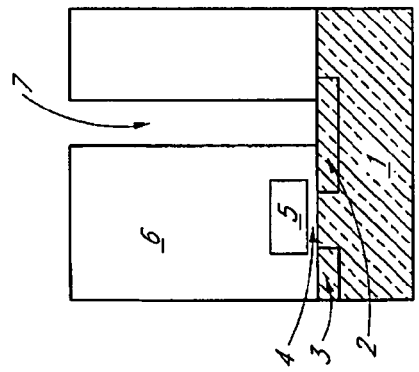
Figure 1D:
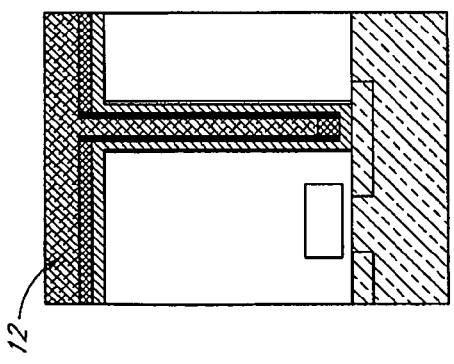

As for at least one type of metal atom, Ta or Ti is an optimal metal. Here, the alloy films containing at least one type of metal atom and Ru are formed successively in the contact hole 7, but the Ru composition of each film is different. In FIG. 1(d), a Cu film 12 is formed by means of chemical vapor deposition, for example. Although chemical vapor deposition is a favorable way to form a Cu film, adding Ru facilitates Cu deposition. It is estimated that the same applies to electrolytic plating or non-electrolytic plating in a liquid phase where deposition of Cu film is also facilitated by addition of Ru.

At this time, a Cu film can be formed successively on the alloy films 9, 10, 11 to fill the contact hole 7, without forming voids and seams. In FIG. 1(e), a Cu plug 13 is formed in the contact hole 7 by polishing the Cu film 12 by means of CMP. Furthermore in FIG. 1(f), an upper-layer Cu wiring 14 is formed. Numeral 5 in FIG. 1 indicates a transistor gate electrode wiring. Because this Ru alloy film is formed on a Cu barrier film 8 having sufficient reliability, diffusion of Cu into the transistor's diffusion layer is effectively prevented and this in turn prevents deterioration of transistor characteristics. However, the structure need not have a transistor, such as a structure in which a Ru alloy film 9 is formed in a similar manner on a Cu barrier film 8 for preventing diffusion of Cu.

Figure 2:
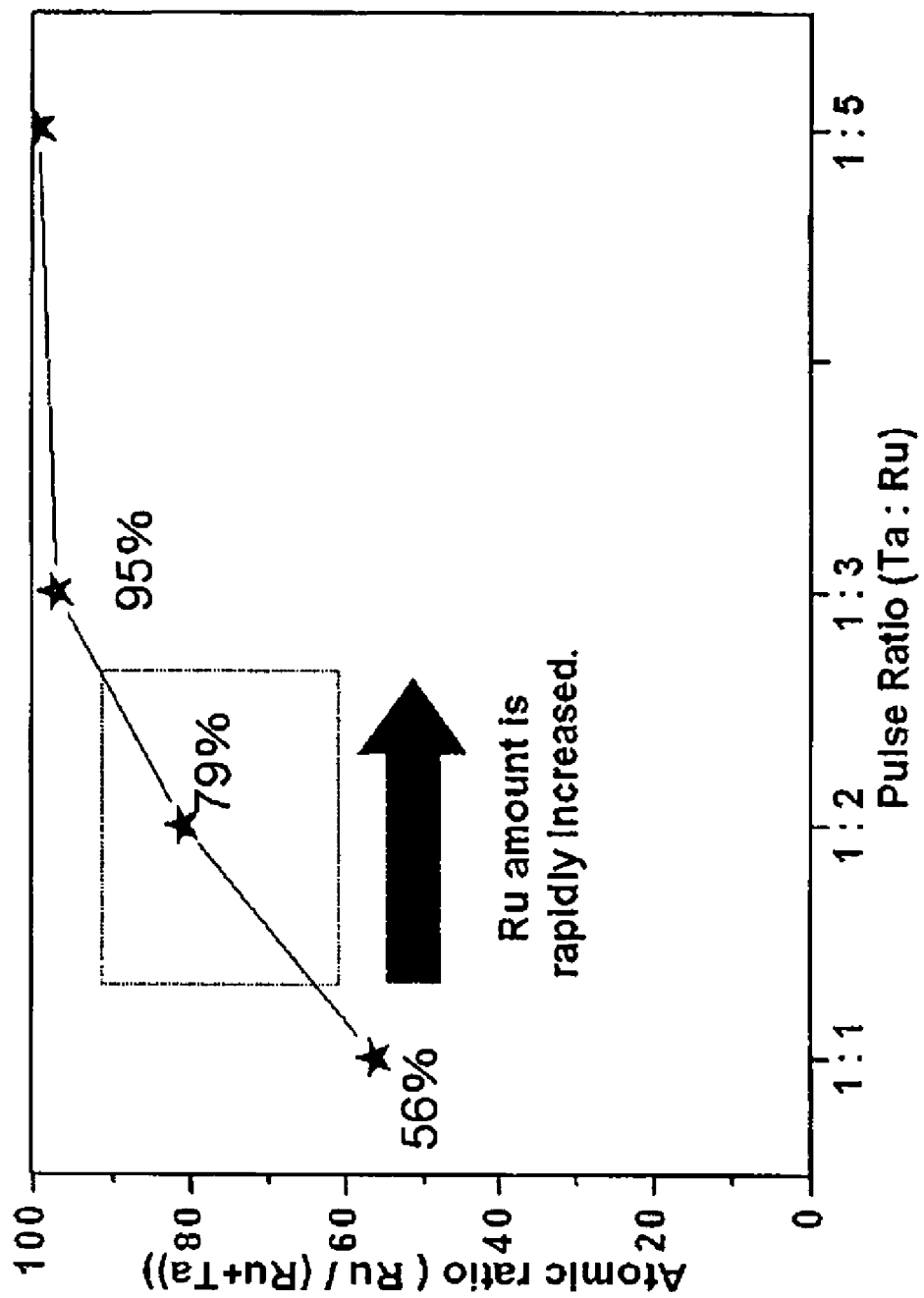
FIG. 2 is a graph showing the pulse-dependency of the atomic ratio of Ru/(Ru+Ta) according to an embodiment of the present invention.

FIG. 2 shows the pulse ratio of Ta and Ru and atomic ratio of Ta and Ru. In order that contact holes can be filled in a suitable manner by Cu-CVD, the Ru/(Ta+Ru) atomic ratio in the film is preferably in a range of approx. 60 to 90%. The atomic ratio, and pulse ratio in the ALD process, shown in this graph apply to the Ta material and Ru material used in an embodiment of the present invention. If other Ta material and Ru material are used, an optimal pulse ratio will change. Accordingly, the pulse ratio is adjusted according to the materials (if other materials are used, an optimal pulse ratio will change to 1:5, etc., instead of 1:2). On the other hand, carbon and nitrogen atoms are also contained in addition to Ru and Ta atoms.

Figure 3A:
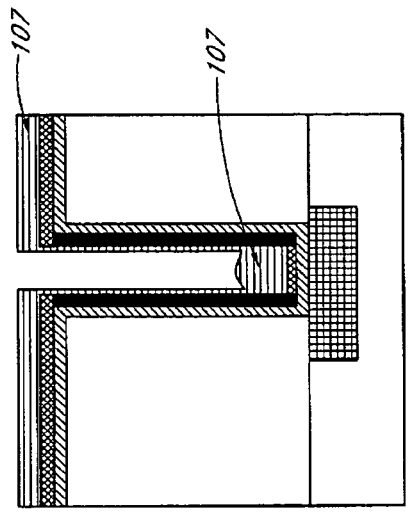
FIGS. 3(a) to 3(d) are schematic cross sections of a partially fabricated integrated circuit, showing Cu filling processes in a via hole according to an embodiment of the present invention.
Figure 4:
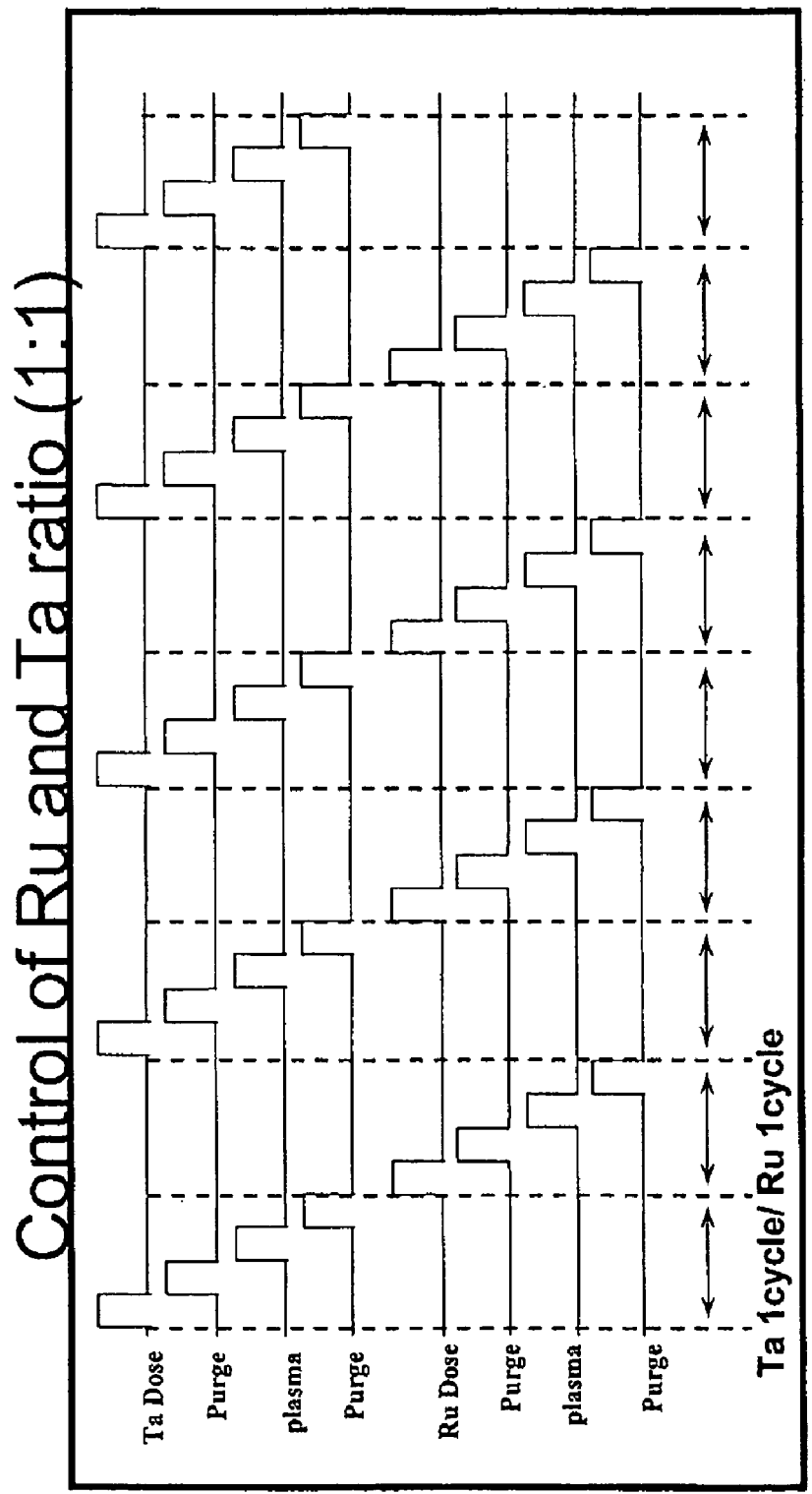
FIG. 4 is a timing chart showing a atomic layer deposition sequence for forming a Ta—Ru alloy according to an embodiment of the present invention (Ta:Ru=1:1).

In FIG. 3(a), a connection hole 104 is formed in an interlayer insulation film 103 provided on the lower-layer wiring 102 inside an interlayer insulation film 101. Here, a TaN film or TaNC film 105 is formed as a Cu barrier film, and an alloy film of Ta and Ru 106 is formed further. This alloy of Ta and Ru is formed by atomic layer deposition shown in FIG. 4. Here, the pulse ratio of Ta and Ru is 1. Atomic layer deposition is basically implemented by repeating a sequence comprising four steps, including a step to supply material to a substrate, a step to purge the material, a step to apply hydrogen plasma, and a step to purge the hydrogen. In FIG. 4, repeating the atomic layer deposition of Ta material and that of Ru material forms an alloy film constituted by Ta and Ru.

In an embodiment, Ru materials that can be used for this purpose have a molecule with two P-diketone ligands expressed by chemical formula (1) or (2). These materials are broken down by hydrogen plasma to give Ru. Accordingly, the Ta—Ru alloy 106 shown in FIG. 4 can be formed by atomic layer deposition using plasma as shown in FIG. 4. In the case of atomic layer deposition using plasma, self-bias voltage is applied to the substrate and therefore the reaction tends to accelerate on surfaces running in parallel with the substrate plane due to hydrogen ions, and this effect is notable with the aforementioned Ru materials. Accordingly, the Ru composition ratio is higher and the film is finer at the bottom face compared to the side face of the connection hole.

On the other hand, Ta of the same composition can be formed on both the side face and bottom face of the connection hole if TAIMATA (Tertiaryamylimidotris(dimethylamido)tantalum), TBTDET (Ta(N-i-C4H9)[N(C2H5)2]3), PDMAT (Ta[N(CH3)2]5) or the like is used as a Ta material. Therefore, in atomic layer deposition based on a combination of Ta and Ru, the Ru composition varies between the side face and bottom face of the connection hole. The schematic views provided by FIGS. 3(b), (c) and (d) show the process of Cu film deposition. As you can see, the deposition speed is fast on the bottom face (107), while the speed is slow on the side face (108), and the connection hole is filled (109) as a film is deposited at these different speeds.

FIG. 1 shows an embodiment for a contact hole, while FIG. 3 shows an embodiment for a via hole. While the Cu barrier metal film 8 provides the underlayer for a Ru alloy film in FIG. 1, in FIG. 3 the Cu barrier film 105 (TaN film, TaNC film) provides the underlayer. In the case of a contact hole, the bottom of the contact hole is constituted by silicon or metal silicide, and the Cu barrier metal 8 is formed on top. In the case of a via hole, on the other hand, the lower layer 102 is likely a Cu wiring or W wiring. If the lower layer is a Cu wiring, an alloy having good adhesion with Cu is needed as a Cu barrier metal. If the lower layer is a W wiring, however, normal TaN or TaNC is sufficient. A normal TaN or TaNC film is also sufficient at the bottom of a contact hole because the underlayer is not Cu. Accordingly, the barrier metal structure for contact holes and via holes should be changed depending on whether a Cu wiring is present in the lower layer. If Cu is present in the underlayer, the Cu barrier film can be constituted by a TaN, TaNC, TiN, TiMC or RuTaNC film. A Ru alloy film can also be used, just like a seed layer, although the composition may be different from a seed layer.

Figure 5:
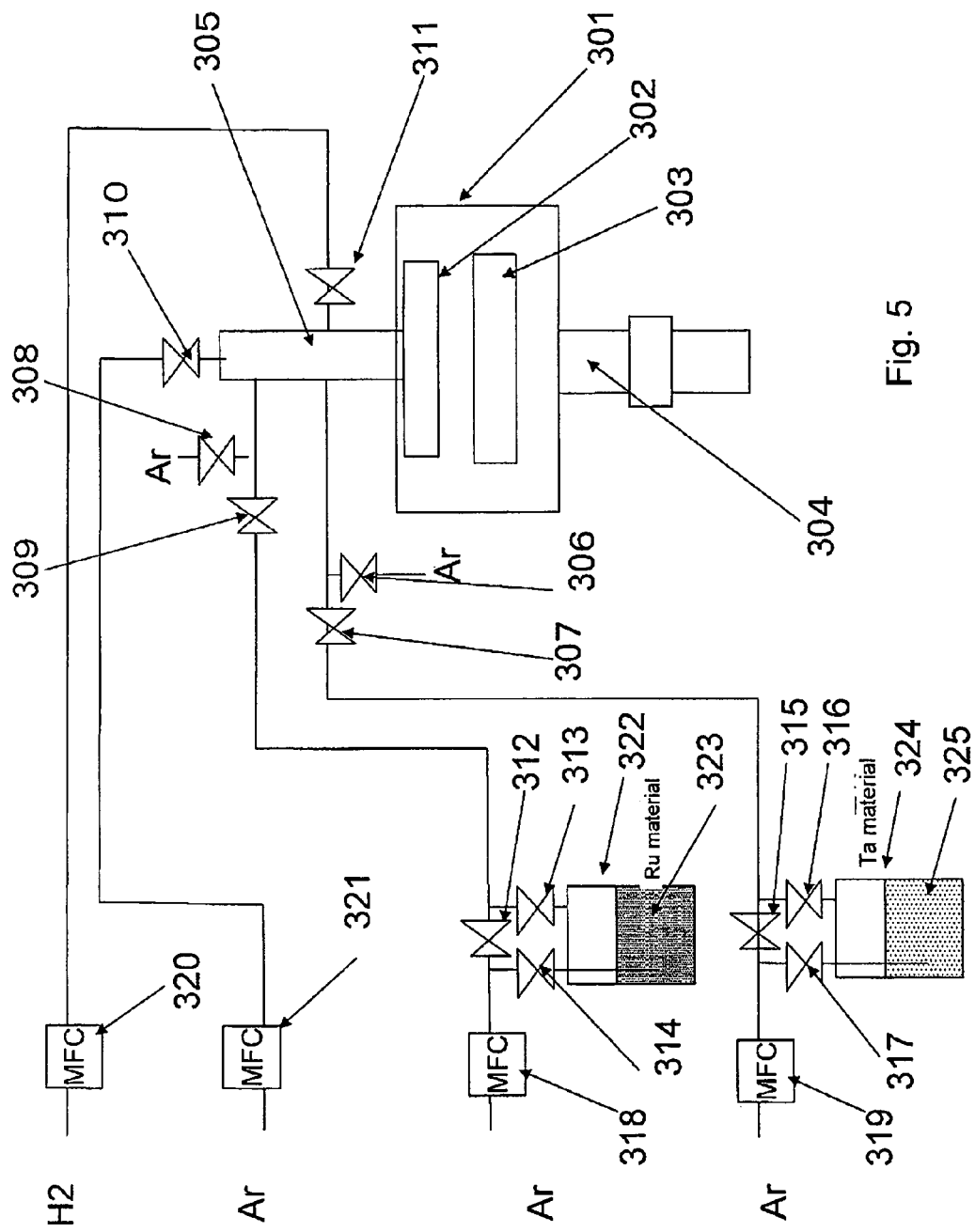
FIG. 5 is a schematic diagram showing an apparatus for atomic layer deposition usable in an embodiment of the present invention.

FIG. 5 shows the structure of an atomic layer deposition apparatus that can be used in an embodiment of the present invention.

A shower head 302 and a substrate heating table 303 are installed in an reaction apparatus 301, and an exhaust 304 for evacuation is connected to the reaction apparatus. An introduction port for mixing material gas 305 is connected to the shower head 302. Connected to this introduction port for mixing material gas 305 is a material gas introduction pipe. Hydrogen gas is introduced through an introduction valve 311 from a flow-rate control 320. Ru material is introduced through an introduction valve 309. With Ru material, argon gas being a carrier gas is introduced from a flow-rate control 318 via a valve 314 into a Ru material 323 in a material bottle 322. The bottle 322 is maintained in a heated condition to achieve the necessary vapor pressure. Vapor of the Ru material 323 is introduced by the argon carrier from the valve 309 through a valve 313. Ta material is introduced from an introduction valve 307. With Ta material, argon gas being a carrier gas is introduced from a flow-rate control 319 via a valve 317 into a Ta material 325 in a material bottle 324. The bottle 324 is maintained in a heated condition to achieve the necessary vapor pressure. Vapor of the Ta material 325 is introduced by the argon carrier from the valve 307 through a valve 316.

Next, another embodiment of the present invention is explained. FIG. 6 shows an example of a process to form next-generation Cu wiring based on dual damascene. Shown in FIGS. 6(a) to (e) are schematic cross-section views of a part of copper wiring formed on a silicon substrate. In Fig. 6(a), an interlayer insulation film 202 is formed on a Cu wiring 201, and a Cu wiring via hole area 203 and a Cu wiring area 204 are formed in this interlayer insulation film 202. In FIG. 6(b), a RuTa alloy film 205 to be used as a Cu-diffusion barrier layer is formed by atomic layer deposition. This forming method is explained separately using the process sequence in FIG. 7.

In FIG. 6(c), a Cu film is formed on the RuTa alloy film 205 by chemical vapor deposition. This Cu film becomes a Cu plug 206 and Cu seed layer 207 as explained below. In this case, the filling performance of Cu film can be controlled by controlling the atomic composition of RuTa alloy. By implementing an optimal Ru—Ta composition, fine via holes can be filled using a Cu film formed by chemical vapor deposition. In FIG. 6(c), the via hole is almost completely filled with a Cu film formed in the via hole area 203. Here, Cu filling the via hole area 203 is considered the Cu plug 206. On the other hand, the Cu wiring area 204 is not filled using Cu by chemical vapor deposition. A Cu film by chemical vapor deposition is formed over the surface of the Cu wiring area 204, and therefore this Cu film can be used as a seed layer for electrolytic plating in the next step. Accordingly, the Cu film formed in this Cu wiring area 204 is considered the Cu seed layer 207.

Next, FIG. 6(d) provides a schematic cross-section view showing a Cu plating film 208 formed by using this Cu seed layer 207 as a seed layer for electrolytic plating. In FIG. 6(e), an extra Cu film formed by Cu plating is flattened in a CMP step. This flattening by CMP forms a Cu wiring 209. According to one definition, a via hole area electrically connects the wiring structures above and below it in the thickness direction of the interlayer structure, while a wiring area builds a wiring structure in the direction of vertical plane in the thickness direction.

Although not illustrated in FIG. 6, this embodiment is also applicable to a pattern having only contact holes or via holes, where the contact holes or via holes can be filled by copper by forming a Cu film through chemical vapor deposition after forming a RuTa alloy film having an optimal composition. This filling can be implemented in the form of filling the hole halfway, and then filling the remainder by electrolytic plating.

As for the method for forming Cu wiring based on Cu dual damascene as shown in the embodiment illustrated by FIGS. 6(a) to (e), the fine via hole area 203 is filled by Cu through chemical vapor deposition, while the wiring area 204 is mainly filled by electrolytic plating.

Figure 7:
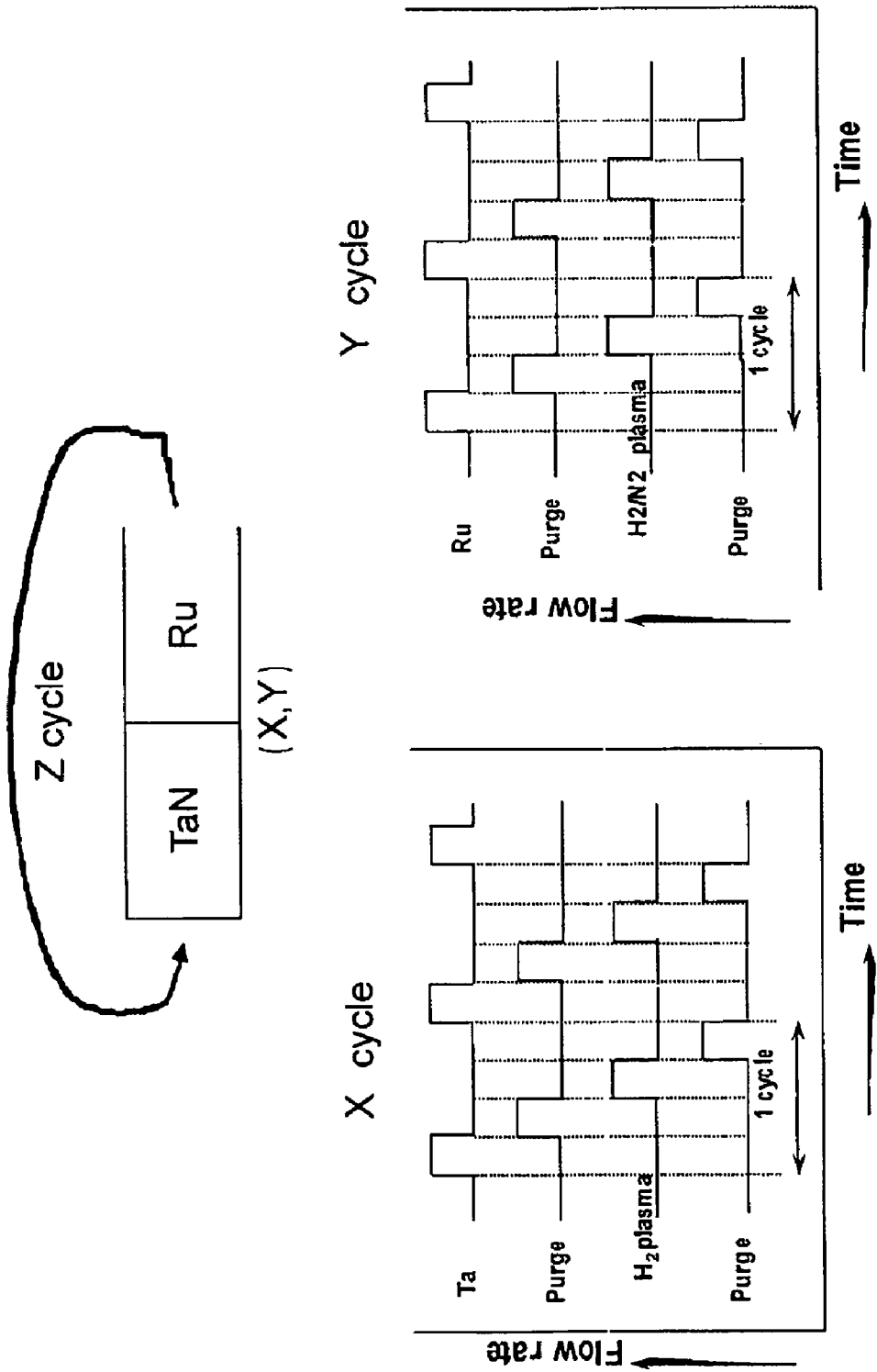
FIG. 7 shows timing charts of an atomic layer deposition sequence for forming a Ta—Ru alloy according to an embodiment of the present invention.
Figure 8:
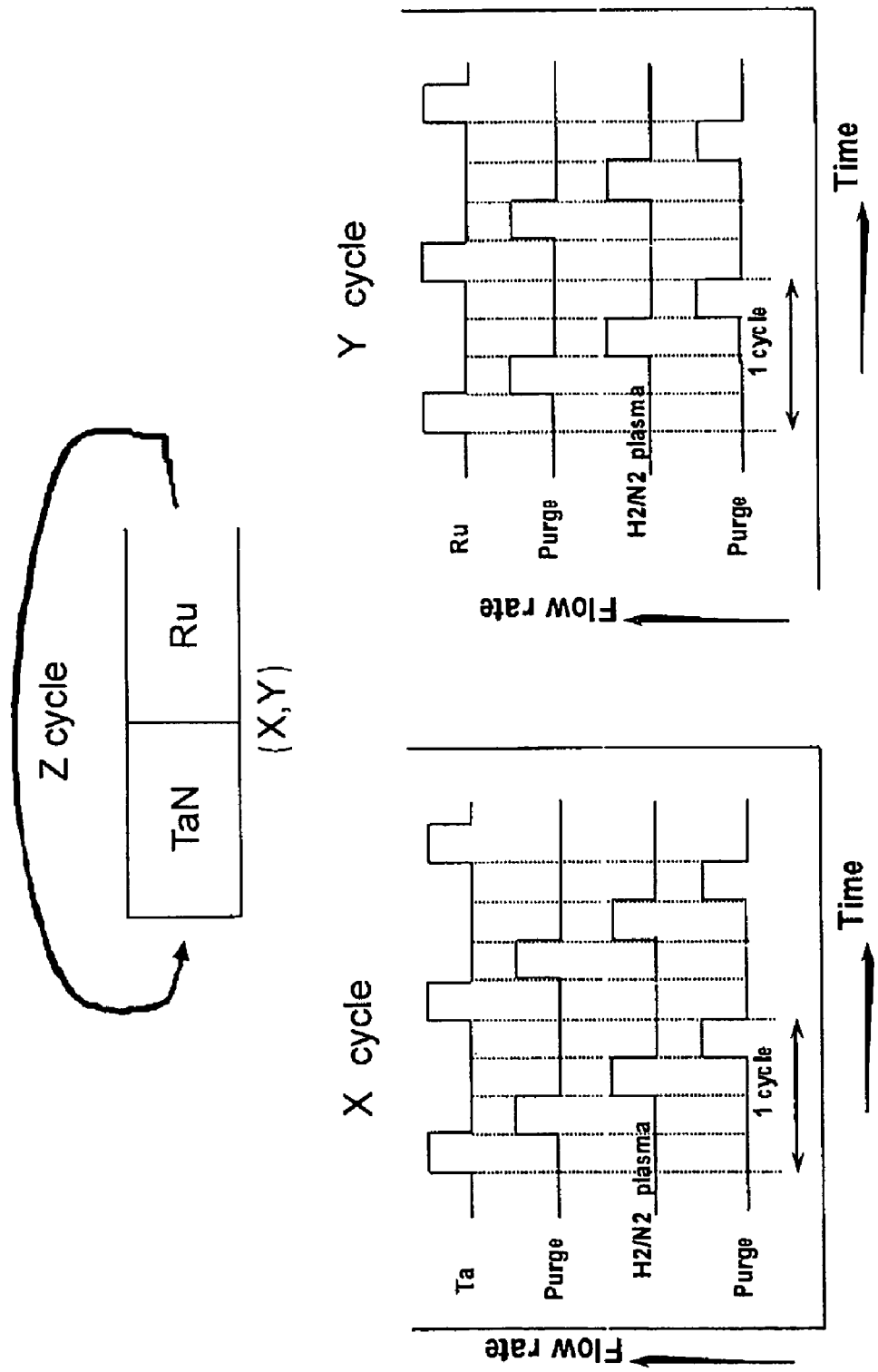
FIG. 8 shows timing charts of an atomic layer deposition sequence for forming a Ta—Ru alloy according to another embodiment of the present invention.
Figure 9:
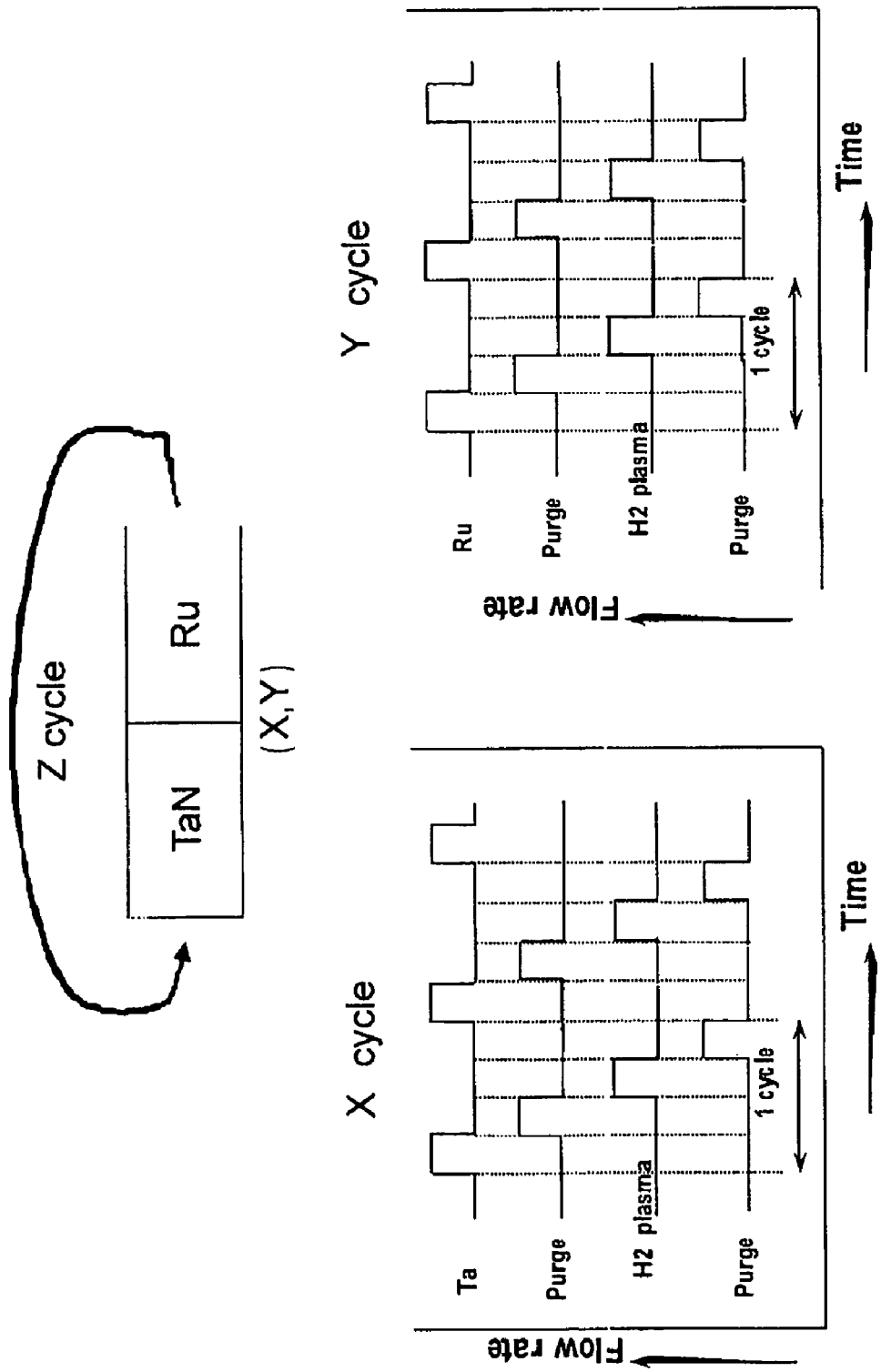
FIG. 9 shows timing charts of an atomic layer deposition sequence for forming a Ta—Ru alloy according to still another embodiment of the present invention.

FIGS. 7, 8 and 9 explain an example of a process to form a RuTa film to be used as the Cu-diffusion barrier film 205 in order to implement the process shown in FIG. 6. In FIG. 7, Ta material is introduced and purged and H2 plasma is applied in this order for X cycles, and then Ru material is introduced and purged and H2/N2 plasma is applied in this order for Y cycles. In this case, after the introduction of Ta material the adsorbed Ta material is broken down by plasma, and it is estimated that formation of Ta—C bond and Ta—N bond is promoted at the same time. Also, after the introduction of Ru material the adsorbed Ru material is broken down by plasma, and it is estimated that formation of Ru—N bond is promoted at the same time. When this happens, Ta—N bond is also introduced to Ta, as well. Accordingly, a film containing Ru, Ta, N and C is formed, and a nitride film or carbide-nitride film is formed as a result. The atomic ratio of Ta and Ru is controlled by repeating the Ta atomic layer deposition cycle X times (such as once or twice, but preferably once), or repeating the Ru atomic layer deposition cycle Y times (such as once to 5 times, but preferably twice to 4 times), while the film thickness (such as 1 to 4 nm, but preferably 1 to 2 nm) is determined by repeating the X and Y cycles Z times (such as 10 to 30 times, but preferably 10 to 20 times). In an embodiment, mainly X is fixed to 1, while Y is controlled in a range of 1 to 5. Accordingly, in an embodiment Y is greater than X. This is because although 0.5 Å of Ta deposits in one cycle, only 0.2 Å of Ru deposits per cycle, and therefore Y, representing Ru pulses, needs to be increased to raise the Ru composition ratio.

In FIG. 8, H2/N2 plasma is used after the introduction of Ta material, and also H2/N2 plasma is used after the introduction of Ru material. Here, after the introduction of Ta material the adsorbed Ta material is broken down by plasma and at the same time the N atoms contained in the material form Ta—N bond and Ta—C bond, while introduction of N2 gas by means of H2/N2 plasma nitrides Ta easily. As a result, nitrogen can be increased further compared to the forming method shown in FIG. 7. After the introduction of Ru material, the adsorbed Ru material is broken down by plasma and at the same time formation of Ru—N bond is promoted. When this happens, Ta—N bond is introduced further. Accordingly, a film containing Ru, Ta, N and C, or nitride film or carbide-nitride film is formed. As in FIG. 7, the atomic ratio of Ta and Ru is controlled by repeating the Ta atomic layer deposition cycle X times, or repeating the Ru atomic layer deposition cycle Y times, while the film thickness is determined by repeating the X and Y cycles Z times. In an embodiment, mainly X is fixed to 1, while Y is controlled in a range of 1 to 5. Accordingly, in an embodiment Y is greater than X. This is because although 0.5 Å of Ta deposits in one cycle, only 0.2 Å of Ru deposits per cycle, and therefore Y, representing Ru pulses, needs to be increased to raise the Ru composition ratio.

In FIG. 9, H2 plasma is used after the introduction of Ta material, and also H2 plasma is used after the introduction of Ru material. Here, after the introduction of Ta material the adsorbed Ta material is broken down by plasma and at the same time the N atoms contained in the material form Ta—N bond, while after the introduction of Ru the adsorbed Ru material is broken down by plasma and the Ta—N bond decreases. Accordingly, in this step carbon tends to enter relatively more than nitrogen. As a result, although a film constituted by Ru, Ta, N and C is formed the nitrogen composition ratio changes between 0 and 10 percent by atom, and can be adjusted to 1 percent by atom or less. Compared to the processes shown in FIGS. 7 and 8, this process forms a film having a smaller composition ratio of N atoms, and therefore a carbide-nitride film or carbide film can be formed. As in FIG. 7, the atomic ratio of Ta and Ru is controlled by repeating the Ta atomic layer deposition cycle X times, or repeating the Ru atomic layer deposition cycle Y times, while the film thickness is determined by repeating the X and Y cycles Z times. In an embodiment, mainly X is fixed to 1, while Y is controlled in a range of 1 to 5. Accordingly, in an embodiment Y is greater than X. This is because although 0.5 Å of Ta deposits in one cycle, only 0.2 Å of Ru deposits per cycle, and therefore Y, representing Ru pulses, needs to be increased to raise the Ru composition ratio.

In an embodiment, the method shown in FIG. 7 can control the nitrogen composition ratio between 15 and 25 percent by atom, and the carbon composition ratio between 10 and 15 percent by atom. The method shown in FIG. 8 can control the nitrogen composition ratio between 20 and 25 percent by atom, and the carbon composition ratio between 10 and 15 percent by atom. The method shown in FIG. 9 can control the nitrogen composition ratio between approx. 0 and 10 percent by atom, and the carbon composition ratio between 20 and 35 percent by atom. Although not illustrated, an embodiment can also be considered where H2/N2 plasma is used in the X cycle while H2 plasma is used in the Y cycle. This embodiment achieves roughly a similar control to what is shown in FIG. 7. The conditions for hydrogen plasma processing and hydrogen/nitrogen plasma processing are explained later.

In the example shown in FIG. 10, a two-layer RuTa alloy structure is shown unlike under the forming methods for dual damascene wirings shown in FIG. 6. Shown in FIGS. 10(a) to (e) are schematic cross-section views of a part of copper wiring formed on a silicon substrate. In FIG. 10(a), an interlayer insulation film 252 is formed on a Cu wiring 251, and a Cu wiring via hole area 253 and a Cu wiring area 254 are formed in this interlayer insulation film 252.

In FIG. 10(b), a laminate structure comprising a RuTa nitride-carbide film 255 and a RuTa carbide film 256, both to be used as Cu-diffusion barrier layers, is shown. The RuTa alloy films are formed by the steps shown in FIGS. 8 and 9, respectively. In FIG. 10(c), a Cu layer is formed by chemical vapor deposition on the RuTa alloy film 256. As explained below, the Cu film provides a Cu plug 257 and Cu seed layer 258. In this case, the filling performance of Cu film can be controlled by controlling the atomic composition of RuTa alloy 256. By implementing an optimal Ru—Ta composition, fine via holes can be filled using a Cu film formed by chemical vapor deposition. In FIG. 10(c), the via hole is almost completely filled with a Cu film formed in the via hole area 253. Here, Cu filling the via hole area 253 is considered the Cu plug 257. On the other hand, the wiring area 254 is not filled using Cu by chemical vapor deposition. A Cu film by chemical vapor deposition is formed over the surface of the Cu wiring area 254, and therefore this Cu film can be used as a seed layer for electrolytic plating in the next step. Accordingly, the Cu film formed in this Cu wiring area 254 is considered the Cu seed layer 258.

Next, FIG. 10(d) provides a schematic cross-section view showing a Cu plating film 259 formed by using this Cu seed layer 258 as a seed layer for electrolytic plating. In FIG. 10(e), an extra Cu film formed by Cu plating is flattened in a CMP step. This flattening by CMP forms a Cu wiring 260.

Although not illustrated in FIG. 10, this embodiment is also applicable to a pattern having only contact holes or via holes, where the contact holes or via holes can be filled by copper by forming a Cu film through chemical vapor deposition after forming a RuTa alloy film having an optimal composition. This filling can be implemented in the form of filling the hole halfway, and then filling the remainder by electrolytic plating.

As for the method for forming Cu wiring based on Cu dual damascene as shown in the embodiment illustrated by FIGS. 10(a) to (e), the fine via hole area 253 is filled by Cu through chemical vapor deposition, while the wiring area 254 is mainly filled by electrolytic plating.

Figure 11:
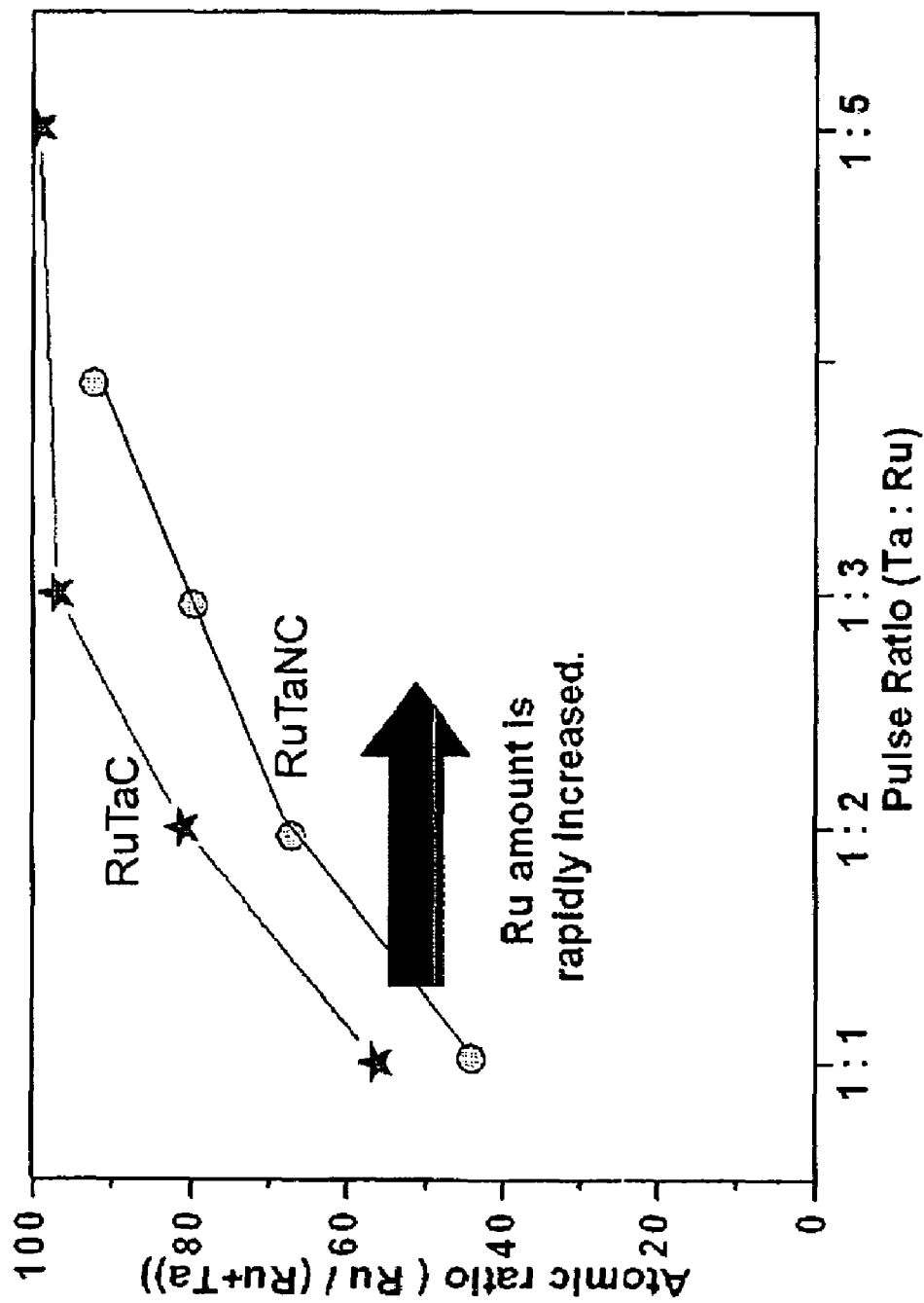
FIG. 11 is a graph showing the pulse-dependency of the atomic ratio of Ru/(Ru+Ta) for RuTaC film and RuTaNC film according to an embodiment of the present invention.

FIG. 11 shows the Ru/(Ru+Ta) ratios in percent by atom for the RuTaNC film (according to Example 2) and RuTaC film (according to Example 1) formed by the methods shown in FIGS. 8 and 9, respectively. The ratio for the RuTaC film follows the same trend in the graph shown in FIG. 2. Also with the RuTaNC film, the atomic ratio of Ru and Ta can be controlled by setting the continuation cycles of Ta pulses and Ru pulses during atomic layer deposition to 1 and 1, 1 and 2, 1 and 3, and 1 and 4, respectively.

A RuTaC film formed in an embodiment conforming to the method shown in FIG. 9 achieves good filling of via holes when the pulse ratio of Ta and Ru is 1:2. As for the specific range, the Ru/(Ru+Ta) atomic ratio is preferably in a range of 70 to 95%, including cases where the aforementioned pulse ratio is 1:1 or 1:3. On the other hand, favorable filling can be achieved with a RuTaNC film formed in an embodiment conforming to the method shown in FIG. 7 when the pulse ratio of Ta and Ru is 1:3. As for the specific range, the Ru/(Ru+Ta) atomic ratio is preferably in a range of 60 to 90%, including cases where the aforementioned pulse ratio is 1:2 or 1:4.

Figure 12A:
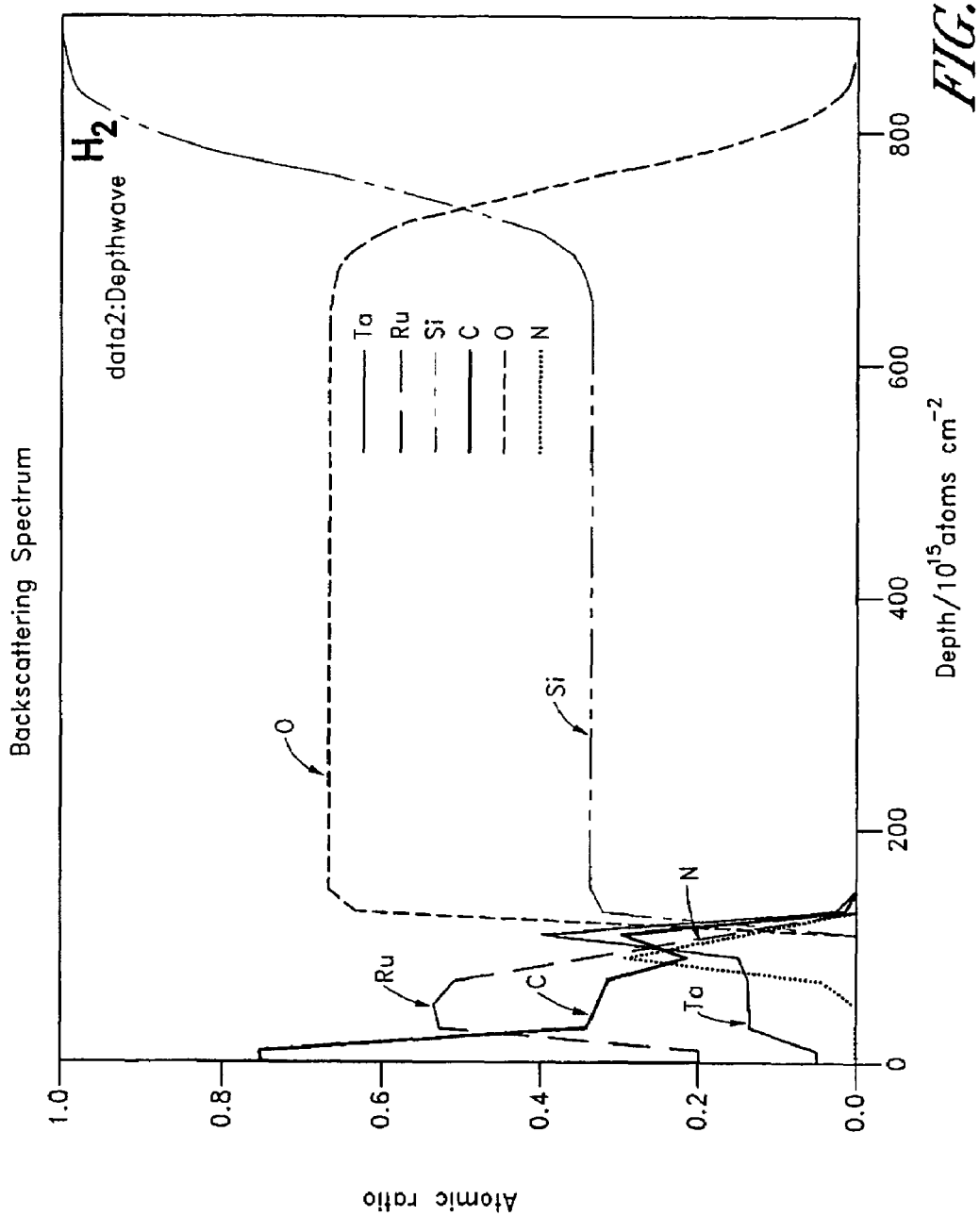
FIGS. 12A and 12B show backscattering spectra of RuTa alloys formed using H2 plasma and H2/N2 plasma, respectively, according to an embodiment of the present invention.
Figure 12B:
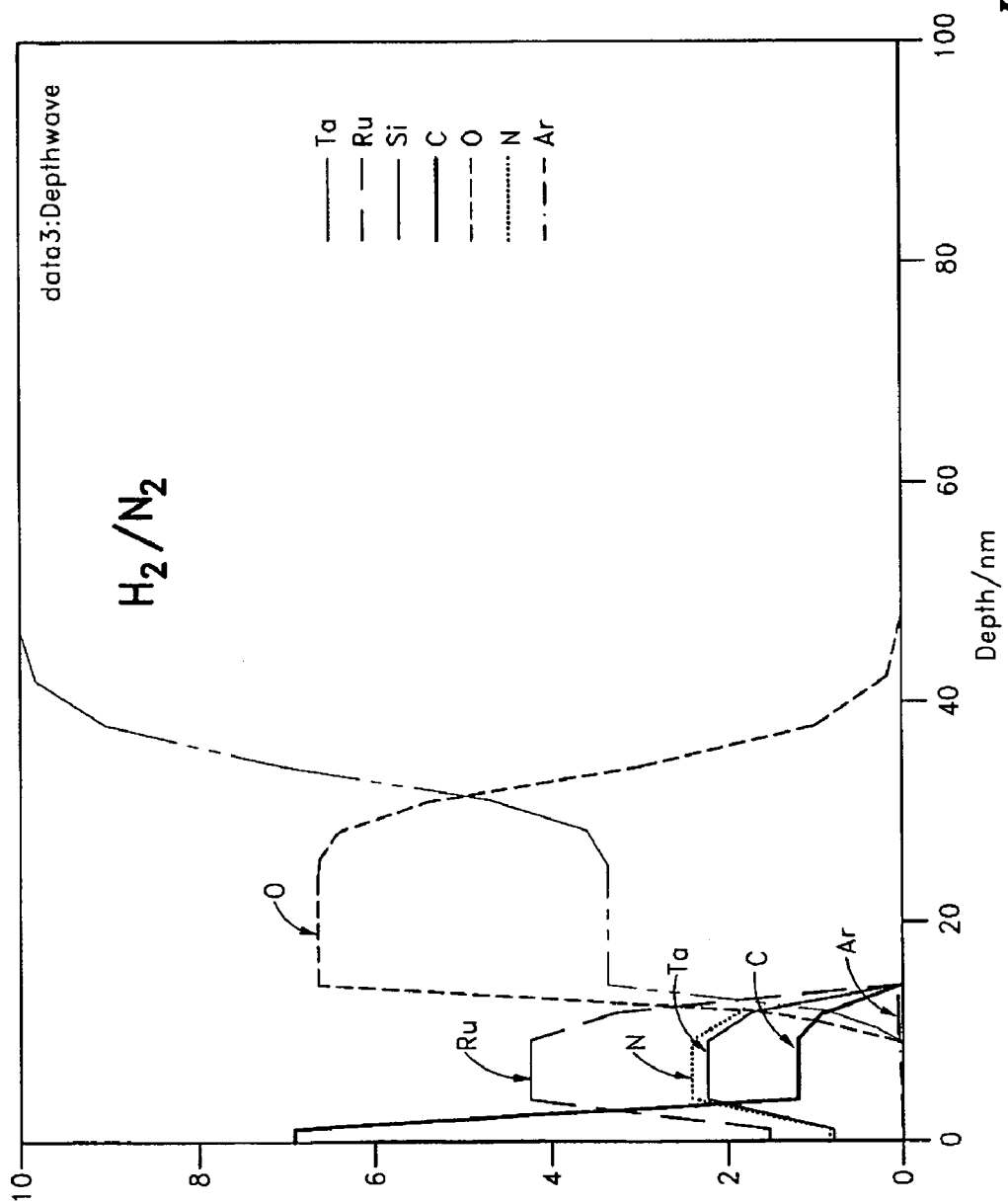

FIGS. 12A and 12B show the composition ratios based on Rutherford backscattering when a film was formed at a Ta—Ru pulse ratio of 1:2 using the method shown in FIG. 9 (according to Example 1), and at a Ta—Ru pulse ratio of 1:2 using the method shown in FIG. 8 (according to Example 2). When H2 plasma was used (FIG. 9, FIG. 12A), the Ru composition ratio tended to become higher. When H2/N2 plasma was used (FIG. 8, FIG. 12B), the Ru composition ratio tended to be lower compared to when H2 plasma was used. The film compositions under H2 plasma and H2/N2 plasma are shown below.

|  | Detected Elements | | | |
| --- | --- | --- | --- | --- |
|  | Ru | Ta | N | C |
| H$_2$ Plasma (Ta:Ru = 1:2) | 53.6 | 13.6 | — | 32.8 |
| H$_2$/N$_2$ Plasma (Ta:Ru = 1:2) | 42.1 | 22.0 | 23.8 | 11.8 |

Figure 13A:
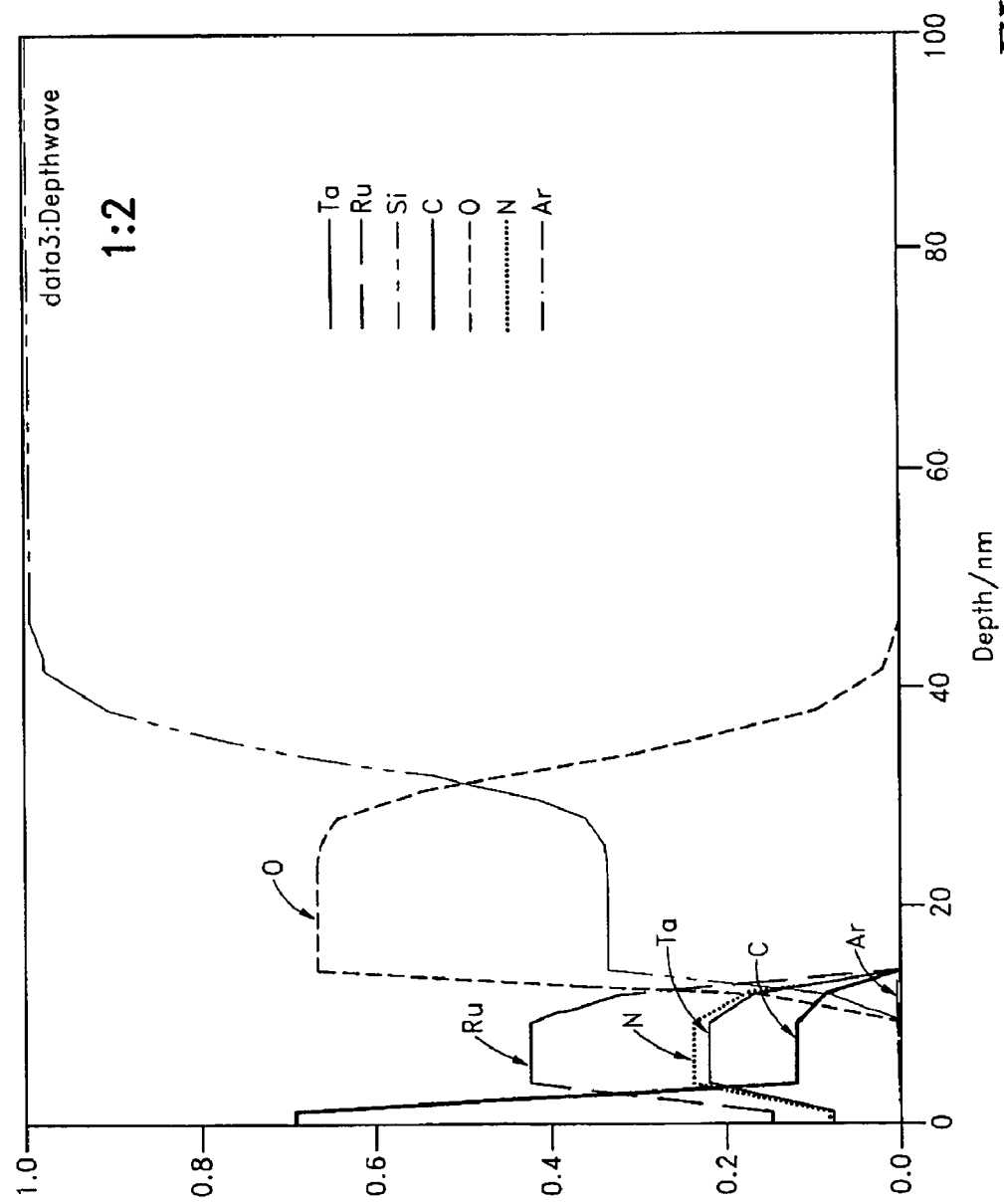
FIGS. 13A and 13B show backscattering spectra of RuTa alloys formed using a Ta/Ru ratio of 1/2 and 1/3, respectively, according to an embodiment of the present invention.
Figure 13B:
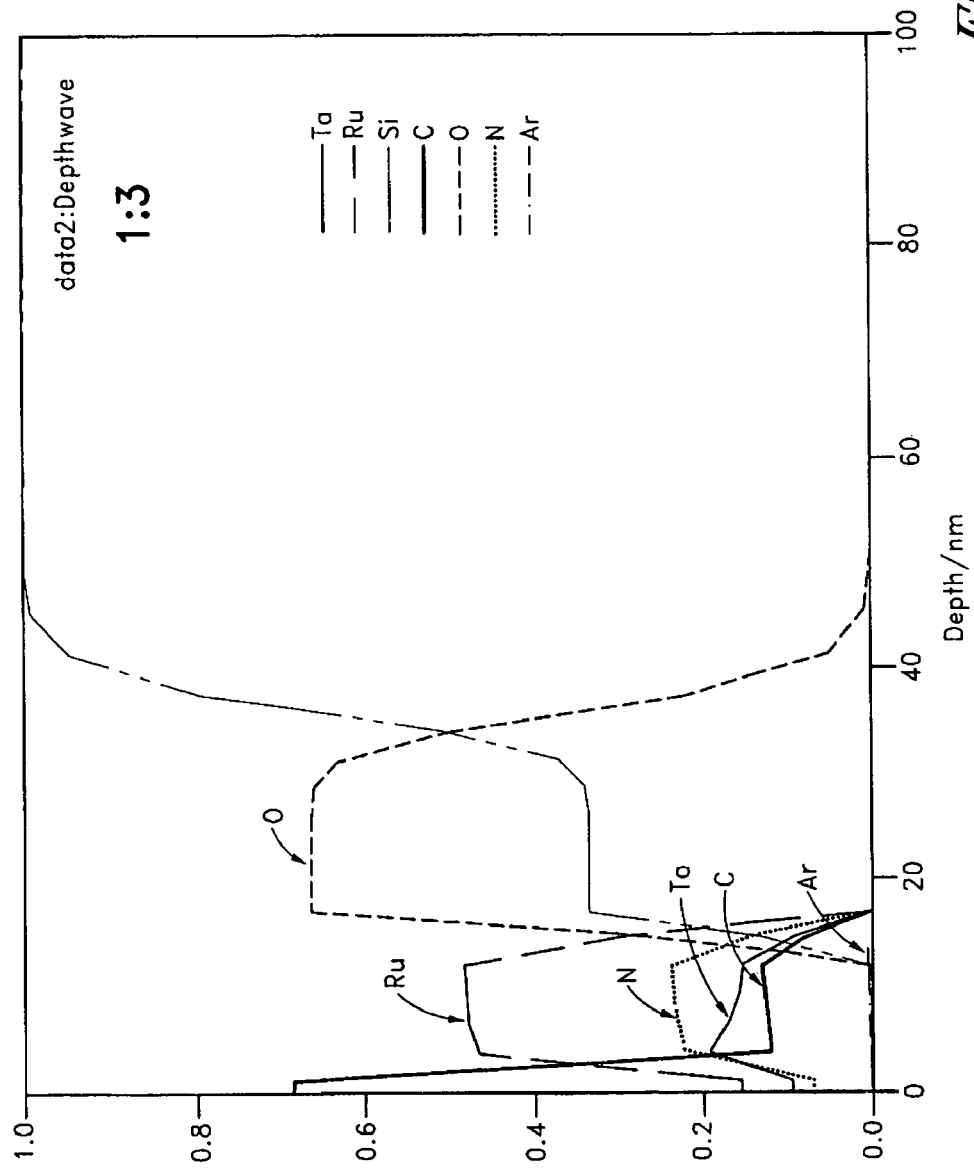

On the other hand, FIGS. 13A and 13B, and the table below, show the dependence on the Ru—Ta pulse ratio of the atomic composition of a RuTa nitride-carbide film formed by H2/N2 plasma. When the Ta—Ru pulse ratio was 1:2 (FIG. 13A) or 1:3 (FIG. 13B), the Ru/(Ru+Ta) ratio increased as the Ru pulses increased, but the nitrogen composition and carbon composition were roughly stable at around 23% and 12%, respectively. A RuTa nitride-carbide film of this nitrogen composition can ensure favorable Cu barrier property. Accordingly in the laminate RuTa alloy film shown in FIG. 10, the RuTa nitride-carbide film 255 functions as a good Cu barrier film, while the Ru—Ta carbide film 256 functions as a seed layer for filling the via hole by Cu.

|  | Detected Elements | | | |
| --- | --- | --- | --- | --- |
|  | Ru | Ta | N | C |
| Ta:Ru = 1:2 | 42.1 | 22.0 | 23.8 | 11.8 |
| Ta:Ru = 1:3 | 47.5 | 17.2 | 22.7 | 12.2 |

Also, it is possible to form a film offering excellent Cu barrier property instead of the RuTa alloy film 205 shown in FIG. 6 or RuTa nitride-carbide film 255 shown in FIG. 10. When the adhesion with the copper wiring in the lower layer is considered, Ru content in this film is effective in improving the adhesion. To be specific, the RuTa nitride-carbide film 255 in FIG. 10 functions effectively as a Cu barrier or Cu adhesion layer.

As explained above, FIGS. 7 to 9 show the manufacturing methods to form an alloy film constituted by Ta and Ru by repeating the atomic layer deposition of Ta material and atomic layer deposition of Ru material. In an embodiment, Ru materials that can be used for this purpose may be those having a molecule with two β-diketone ligands. Or, materials having only cyclic dienyl groups or materials having a non-cyclic dienyl group in either position can also be applied as Ru materials.

As for Ta material, TAIMATA (Tertiaryamylimidotris (dimethylamido)tantalum), TBTDET (Ta(N-i-C4H9)[N(C2H5)2]3) or PDMAT (Ta[N(CH3)2]5) can be used.

These materials can form a RuTa alloy under either H2 plasma pulses or H2/N2 plasma pulses. When H2 plasma pulses shown in FIG. 9 are used, however, the RuTa alloy tends to become a carbide. When H2/N2 plasma pulses shown in FIGS. 7 and 8 are used, on the other hand, the RuTa alloy becomes a nitride or nitride-carbide.

Examples of the present invention are explained in further details below.

The present invention will be explained in detail with reference to drawings showing preferred embodiments of the present invention. However, the drawings are not intended to limit the present invention. In the present disclosure where conditions and/or structures are not specified, the skilled artisan in the art can readily provide such conditions and/or structures, in view of the present disclosure, as a matter of routine experimentation. Additionally, in the present disclosure, the numerical numbers applied in embodiments can be modified by a range of at least ±50% in other embodiments, and the ranges applied in embodiments may include or exclude the endpoints.

EXAMPLE 1

An example where a Ta—Ru alloy is formed after a TaN film is formed as a Cu barrier over a connection hole similar to the one shown in FIG. 3 using the atomic layer deposition apparatus in FIG. 5 and sequence and process conditions shown in Table 1 below, is explained.

A substrate in which the connection hole shown in FIG. 3(a) has been formed is introduced into the atomic layer deposition apparatus in FIG. 5. The apparatus shown in FIG. 5 is an atomic layer deposition apparatus 301 to which a cassette loader (not shown), an atmospheric transfer robot (not shown), a load lock (not shown), and a vacuum transfer chamber (not shown) are connected. The atomic layer deposition apparatus 301 is connected to gas line, and also has a Ru material supply part 322, a Ta material supply part 324, a H2 gas supply part 320, and argon gas supply parts 318, 319 for transporting Ru material 323 and Ta material 325, respectively. The reaction apparatus 301 connected to heated gas lines and a hydrogen gas line. When introduced from the cassette loader, a substrate is transferred by the atmospheric transfer robot to the load lock and vacuum transfer chamber and finally introduced into the atomic layer deposition apparatus 301.

Figure 3B:
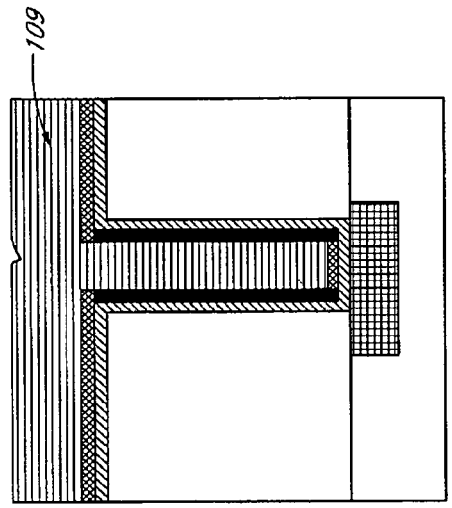
Figure 3C:
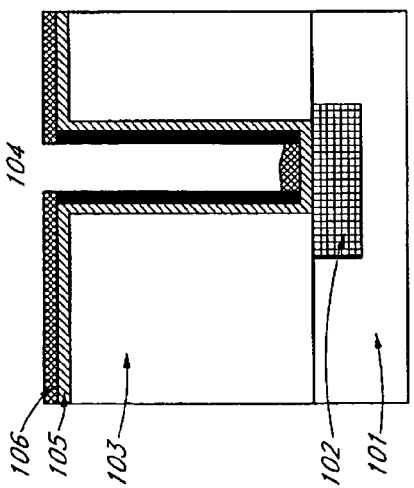
Figure 3D:
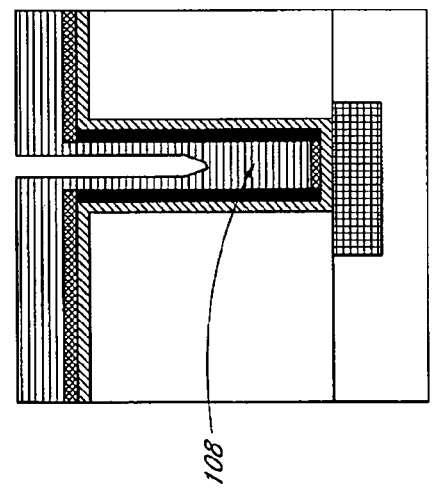

In each atomic layer deposition apparatus, the transferred substrate having the structure shown in FIG. 3(a) is processed at a temperature of 300° C., vacuum of 1,000 Pa, hydrogen flow rate of 500 sccm and Ar gas flow rate of 1,200 sccm for 1 minute. This is to reduce in a reducing atmosphere the oxide layer on the Cu wiring surface in the lower layer exposed at the bottom of a via hole 108, and consequently reduce the via resistance. After this step, the Cu barrier metal layer 105 shown in FIG. 3(b) is formed. The metal layer 105 is formed as a 3-nm TaN film 105 by repeating 50 times a sequence comprising only the Ta supply step, Ta purge step, hydrogen plasma step and hydrogen purge step in FIG. 4. Thereafter, one Ta cycle and two Ru cycles are combined according to the cycle chart in FIG. 4 and repeated 20 times to form an alloy film constituted by Ta and Ru 106. Here, TAIMATA is used as the Ta material and a material conforming to chemical formula (1) or (2) is used as the Ru material.

Figure 15:
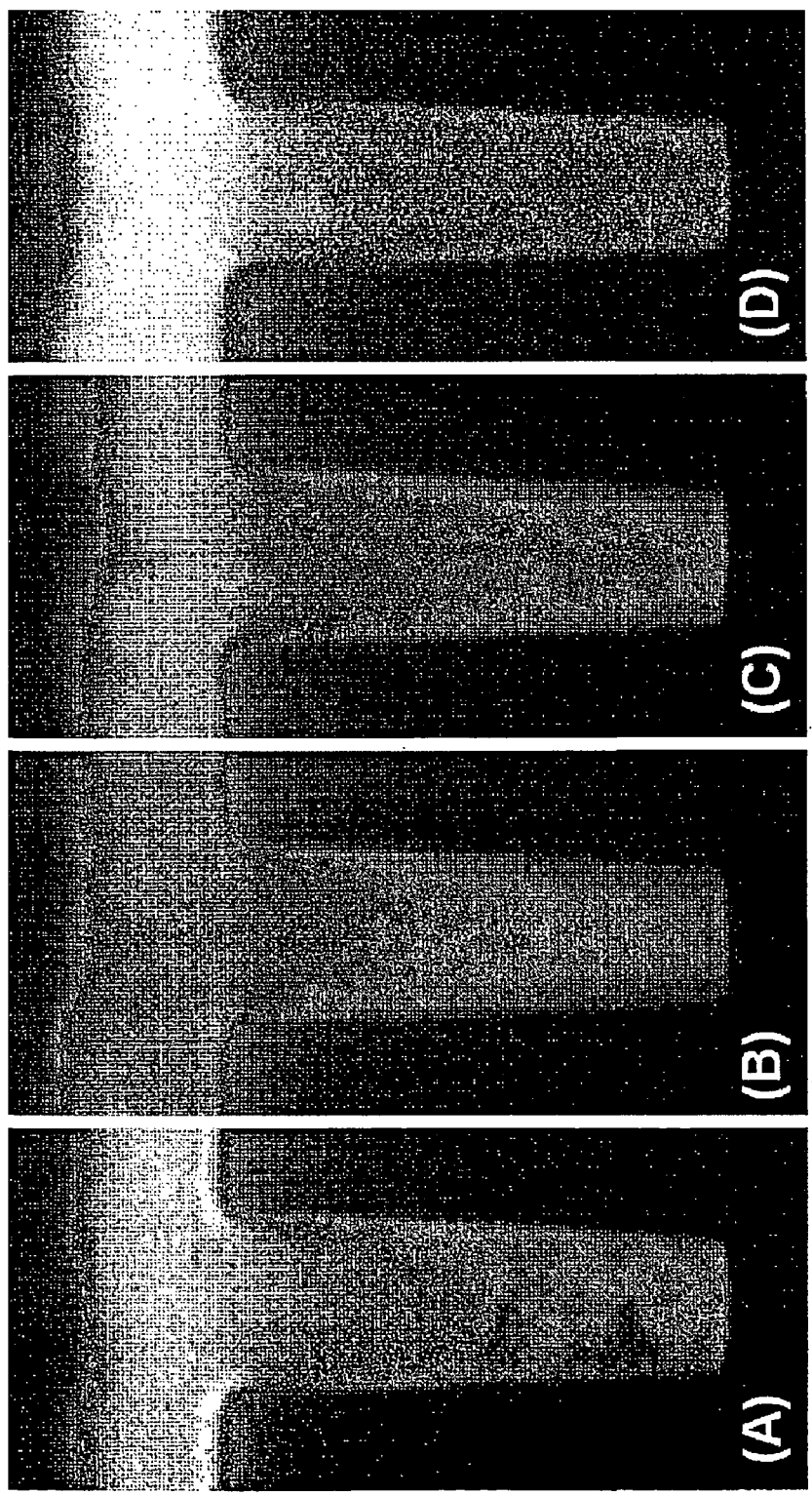
FIG. 15 shows micrographs of cross sections of Cu filling connection holes according to an embodiment of the present invention. (A): Ru/(Ru+Ta)=0.56 (showing a void); (B): u/(Ru+Ta)=0.79; (C): Ru/(Ru+Ta)=0.95 (showing a seam); (D): Ru/(Ru+Ta)=1.0 (showing a seam).

FIG. 15 shows the obtained results. For comparison purposes, samples of the Ta—Ru alloy 106 in FIG. 4 formed at varying Ta—Ru pulse ratios of 1:1, 1:2 and 1:3, as well as a via hole sample of a pure Ru film formed, were used to evaluate the filling characteristics by forming Cu film. FIGS. 15(A), (B) and (C) are cross-sections observed by a scanning electron microscope of the filled shapes obtained when TaRu alloys formed with Ta—Ru pulse ratios of 1:1, 1:2 and 1:3 were covered with a Cu film formed by Cu-CVD using (trimethylvinylsilyl)hexafluoroacetylacetonato copper.

Figure 16:
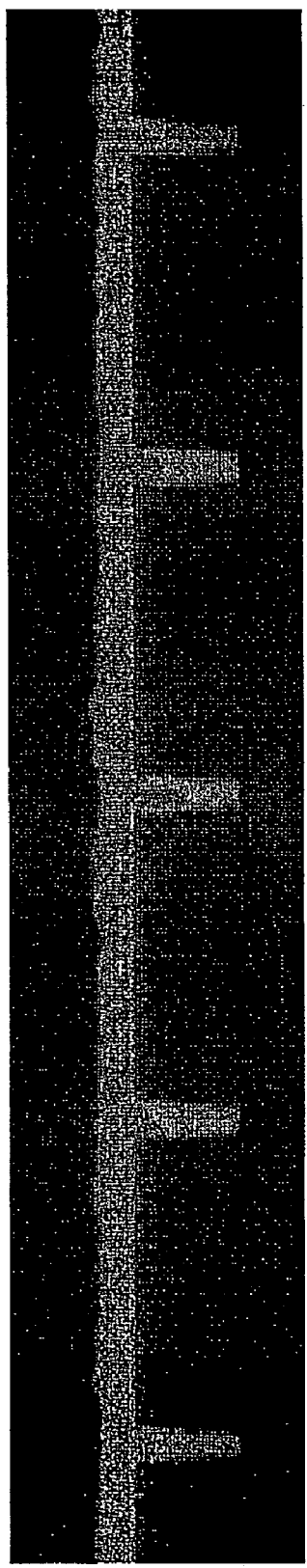
FIG. 16 is a photograph of a cross section of Cu filling connection holes according to an embodiment of the present invention.

The via hole size was 75 nm in diameter, and the aspect ratio was 2.7. FIG. 15(D) is a cross-section observed by a scanning electron microscope of the filled shape obtained when only a Ru film was formed. As shown by the results in FIGS. 15(A), (B), (C) and (D), the Cu film was deposited roughly at the same speed in the flat area. As for the Cu film inside the via hole, on the other hand, notable differences are evident. In FIGS. 15(C) and (D), seams are observed in the Cu film. In FIG. 15(A), on the other hand, voids are observed. In FIG. 15(B), the filling Cu film was confirmed to be free from voids and seams. FIG. 16 shows the results of observing cross-sections of multiple via holes identical to the one formed in FIG. 15 at a Ta—Ru pulse ratio of 1:2. Cu filling was achieved in all via holes shown in FIG. 16, and all other observed via holes also exhibited equally favorable filling characteristics.

These results suggest that seams form more easily when the Ru atomicity increases compared to the Ta atomicity (=Ru pulse ratio increases) as shown in FIGS. 2 and 15. On the other hand, as the Ta atomicity increases generation of voids becomes more likely. This is because the locations where the material, such as (trimethylvinylsilyl)hexafluoroacetylacetonato copper, adsorbs without being broken down increase when there are fewer Ru atoms. If there are more Ru atoms, on the other hand, Cu material breaks down at any location. The difference in Cu breakdown between the bottom and side face of the via hole becomes significant when the pulse ratio of Ta to Ru is 2, provided that the materials used in this embodiment of the present invention are used. This difference is explained as follows. In the plasma hydrogen step, plasma hydrogen and nitrogen step, or plasma NH3 step during Ru—Ta forming, plasma processing occurs more efficiently at the bottom face of the via hole, while the contribution of plasma is smaller on the side face. As a result, a Cu film grows more slowly on the side face and faster on the bottom face.

Table 1 shows the specific process conditions.

TABLE 1

| FIG. 6 | | | step | | | | | | | |
|---|---|---|---|---|---|---|---|---|---|---|
| No | Type | Flow gas | Ta pulse | Ta purge | H2 pulse | H2 purge | Ru pulse | Pu Purge | H2 pulse | H2 purge |
| 306 | Valve | Ar Flow | OFF | ON(400) | ON(400) | ON(400) | ON(400) | ON(400) | ON(400) | ON(400) |
| 307 | Valve | Ta Material | ON(400) | OFF | OFF | OFF | OFF | OFF | OFF | OFF |
| 308 | Valve | Ar Flow | ON(400) | ON(400) | ON(400) | ON(400) | OFF | ON(400) | ON(400) | ON(400) |

TABLE 1-continued

FIG. 6

| No | Type | Flow gas | Ta pulse | Ta purge | H2 pulse | H2 purge | Ru pulse | Pu Purge | H2 pulse | H2 purge |
|---|---|---|---|---|---|---|---|---|---|---|
| 309 | Valve | Ru Material | OFF | OFF | OFF | OFF | ON(400) | OFF | OFF | OFF |
| 310 | Valve | Purge Ar Flow | ON(400) | ON(400) | ON(400) | ON(400) | ON(400) | ON(400) | ON(400) | ON(400) |
| 311 | Valve | H2 Flow | OFF | OFF | ON(RF) | OFF | OFF | OFF | ON(RF) | OFF |
| 312 | Valve | Ru Material Bypass | OFF | OFF | OFF | OFF | OFF | OFF | OFF | OFF |
| 313 | Valve | Ru Material Out | ON | ON | ON | ON | ON | ON | ON | ON |
| 314 | Valve | Ru Material In | ON | ON | ON | ON | ON | ON | ON | ON |
| 315 | Valve | Ta Material Bypass | OFF | OFF | OFF | OFF | OFF | OFF | OFF | OFF |
| 316 | Valve | Ta Material Out | ON | ON | ON | ON | ON | ON | ON | ON |
| 317 | Valve | Ta Material In | ON | ON | ON | ON | ON | ON | ON | ON |
| 318 | MFC | Ar Flow | 0 sccm | 0 sccm | 0 sccm | 0 sccm | 400 sccm | 0 sccm | 0 sccm | 0 sccm |
| 319 | MFC | Ar Flow | 400 sccm | 0 sccm | 0 sccm | 0 sccm | 0 sccm | 0 sccm | 0 sccm | 0 sccm |
| 320 | MFC | H2 Flow | 0 sccm | 0 sccm | 500 sccm | 0 sccm | 0 sccm | 0 sccm | 500 sccm | 0 sccm |
| 321 | MFC | Ar Flow | 400 sccm | 400 sccm | 400 sccm | 400 sccm | 400 sccm | 400 sccm | 400 sccm | 400 sccm |

As shown in Table 1, a substrate is transferred to the atomic layer deposition apparatus 301 and placed on the substrate heating table 303, after which the substrate is maintained in this condition normally for 50 seconds or so to achieve uniform heating. The substrate heating table is set to 300° C. (or 200 to 400° C. in an embodiment), while the actual wafer temperature is approx. 290° C. Next, argon gas (or other inert gas; the same applies hereinafter) is supplied by 400 sccm (or 200 to 1,000 sccm in an embodiment) from 308 and 310, respectively, according to the procedure in Table 1, and the 400 sccm of argon gas travels via the valve 317 from the argon flow-rate control 319, gets mixed with the vapor of the Ta material 325 and travels through the valve 316, to be supplied from the valve 307. The supply time of Ta material can be normally set in a range of 0.5 to 2 seconds. At this time, the vacuum pressure is preferably controlled at approx. 300 to 500 Pa. In doing this, an orifice can be provided in the valve 307 to control the argon pressure in order to achieve stable flow rate control.

Next in the Ta purge step, the moment the Ta supply valve 307 is closed the argon flow-rate control 319 is set to 0, as shown in Table 1. At the same time, argon gas is supplied by 400 sccm (or 200 to 1,000 sccm in an embodiment) from the argon supply valve for purge 306 in the Ta supply line. Normally this purge time is adjusted to approx. 1 to 5 seconds. The process pressure at this time is 50 Pa or less, and it is desired that the remaining Ta material be discharged at as low a vacuum level as possible.

Next, the hydrogen pulse step is performed. Here, hydrogen is supplied at a flow rate of 500 sccm (or 200 to 1,000 sccm in an embodiment) by the hydrogen gas flow-rate control 320 by opening the hydrogen gas supply valve 311. Although not illustrated in FIG. 5, the high-frequency shower 302 is impressed with electricity so that high-frequency power (0.1 to 30 MHz, 100 to 1,000 W) is applied between the shower and the heater stage 303, in order to generate hydrogen plasma through matching adjustment. At this time, the process pressure is set between 200 and 500 Pa. The process time is set to approx. 1 to 10 seconds. After this step, the H2 purge step is performed. Here, the hydrogen introduction valve 311 is closed and evacuation is performed for approx. 1 second.

Next, implementation of the Ru atomic layer deposition process is explained using Table 1. A Ru atomic layer can be formed in the same procedure applicable to atomic layer deposition using Ta material.

According to the procedure in Table 1, argon gas is supplied by 400 sccm (or 200 to 1,000 sccm in an embodiment) from 306 and 310, respectively, and the 400 sccm of argon gas travels via the valve 314 from the argon flow-rate control 318, gets mixed with the vapor of the Ru material 323 and travels through the valve 313, to be supplied from the valve 309. The supply time of Ru material can be normally set in a range of 0.5 to 10 seconds. This supply time can be made longer when the vapor pressure of Ru material is low, or shorter when the vapor pressure is high. With the material used in this example, favorable atomic layer deposition could be achieved at a supply time of 5 second at 110° C. Also, the vacuum pressure during the supply is preferably controlled to approx. 300 to 500 Pa. At this time, an orifice can be provided in the valve 309 to control the argon pressure in order to achieve stable flow rate control.

Next in the Ru purge step, the moment the Ru supply valve 309 is closed the argon flow-rate control 318 is set to 0, as shown in Table 1. At the same time, argon gas is supplied by 400 sccm (or 200 to 1,000 sccm in an embodiment) from the argon supply valve for purge 308 in the Ru supply line. Normally this purge time is adjusted to approx. 1 to 5 seconds. The process pressure at this time is 50 Pa or less, and it is desired that the remaining Ru material be discharged at as low a vacuum level as possible. Next, the hydrogen pulse step is performed. Here, hydrogen is supplied at a flow rate of 500 sccm (or 200 to 1,000 sccm in an embodiment) by the hydrogen gas flow-rate control 320 by opening the hydrogen gas supply valve 311. Although not illustrated in FIG. 5, the high-frequency shower 302 is impressed with electricity so that high-frequency power (0.1 to 30 MHz, 100 to 1,000 W) is applied between the shower and the heater stage 303, in order to generate hydrogen plasma through matching adjustment. At this time, the process pressure is set between 200 and 500 Pa. The process time is set to approx. 1 to 10 seconds. After this step, the H2 purge step is performed. Here, the hydrogen introduction valve 311 is closed and evacuation is performed for approx. 1 second. Based on the foregoing steps, a TaRu mixed metal layer 113 was formed.

The above explained the Ta atomic layer deposition process and Ru atomic layer deposition process. These processes are repeated alternately, but the specific sequence such as performing the Ta cycle once (typically once or twice) and Ru cycle twice (typically in a range of once to 10 times), etc., can be adjusted in order to optimize the filling by Cu. Also, the same procedure can be followed in an embodiment where the Ti atomic layer deposition process, etc., is used instead of the Ta atomic layer deposition process.

As shown in FIGS. 15 and 16, favorable results were obtained when one Ta cycle and two Ru cycles were combined.

The Cu-CVD conditions used in this example are shown below. Normally in Cu-CVD, a Cu film is formed by means of thermal decomposition of (trimethylvinylsilyl)hexafluoroacetylacetonato copper. The material is vaporized by a vaporizer at a temperature of 60 to 80° C. by controlling the flow rate to 0.5 to 1 g/min based on liquid mass flow, and supplied to the reaction apparatus. At this time, the reaction pressure should be in a range of 50 to 300 Pa, or preferably in a range of 100 to 200 Pa. Normally the forming temperature is 170 to 200° C., but this process was implemented by adjusting the forming temperature to a range of 90 to 150° C., or a more preferred range of 100 to 130° C. The Cu material is mixed by the vaporizer using argon gas or H2 gas and supplied to the substrate. The flow rates of hydrogen and argon gas are both 300 to 1,000 sccm, or desirably 400 to 800 sccm or so, at which rates a favorable film can be formed fully. This process also was implemented within these ranges. A Cu film could be formed almost without problem with either argon or hydrogen.

With the Ta material and Ru material used in this example, favorable filling can be achieved as long as the Ru/(Ta+Ru) atomic ratio is in a range of 60 to 90%. Take note, however, that relatively large numbers of carbon and nitrogen atoms on the side face of the via hole may suppress Cu-CVD deposition.

In this example filling could be achieved at a pulse ratio of 1:2 and therefore bias voltage was not applied. However, application of bias voltage is expected to improve the filling characteristics with fine holes, etc., having higher aspect ratios. When bias voltage is applied, the atomic composition of Ru relative to all atoms increases at the bottom and decreases on the side face.

EXAMPLE 2

An example of forming a RuTa alloy (RuTaNC film) using the method shown in FIG. 8 through a dual damascene wiring forming process, and then filling the via hole using a Cu film formed by chemical vapor deposition, and filling the wiring layer by Cu formed by electrolytic plating, is explained.

Figure 14:
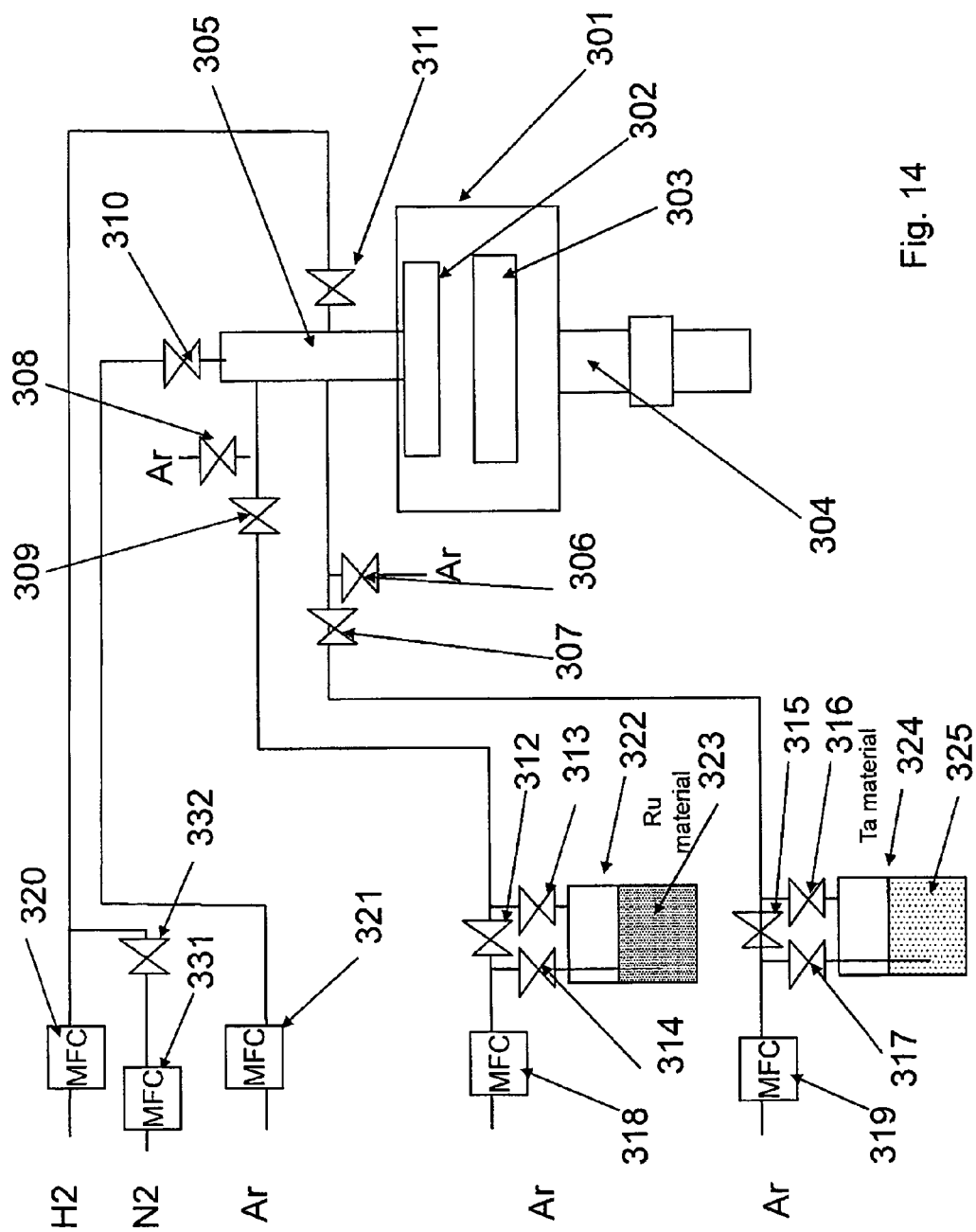
FIG. 14 is a schematic diagram showing an apparatus for atomic layer deposition usable in an embodiment of the present invention.

FIG. 14 is a schematic cross-section view showing the structure of the atomic layer deposition apparatus. Basically, this apparatus has the same structure as what is shown in FIG. 5. A shower head 302 and a substrate heating table 303 are installed in the reaction apparatus 301, and an exhaust 304 for evacuation is connected to the reaction apparatus. An introduction port for mixing material gas 305 is connected to the shower head 302. Connected to this introduction port for mixing material gas 305 is a material gas introduction pipe. Hydrogen gas is introduced through an introduction valve 311 from a flow-rate control 320. Nitrogen gas is connected to the hydrogen gas flow channel from a flow-rate control 331 via an introduction valve 332. Ru material is introduced through an introduction valve 309. With Ru material, argon gas being a carrier gas is introduced from a flow-rate control 318 via a valve 314 into a Ru material 323 in a material bottle 322. The bottle 322 is maintained in a heated condition to achieve the necessary vapor pressure. Vapor of the Ru material 323 is introduced by the argon carrier from the valve 309 through a valve 313. Ta material is introduced from an introduction valve 307. With Ta material, argon gas being a carrier gas is introduced from a flow-rate control 319 via the valve 317 into a Ta material 325 in a material bottle 324. The bottle 324 is maintained in a heated condition to achieve the necessary vapor pressure. Vapor of the Ta material 325 is introduced by the argon carrier from a valve 307 through a valve 316.

FIG. 10(b) shows an embodiment where a laminate RuTa alloy film comprising a RuTa alloy nitride-carbide film 255 and a Ru—Ta alloy carbide film 256 is formed. This embodiment can be implemented by the apparatus explained above.

The RuTaNC film was formed under the conditions shown in Table 2. Since the conditions were basically the same as the forming conditions for RuTaC film in Example 1, except that N2 gas was introduced and H2/N2 plasma was used, the repetitive descriptions are omitted. After the Ta pulsing and Ta purge, H2/N2 plasma processing was implemented as follows. As shown in Table 2, hydrogen is supplied from the hydrogen gas flow-rate control 320 at a flow rate of 500 sccm (or 200 to 1,000 sccm in an embodiment) by opening the hydrogen gas supply valve 311. At the same time, nitrogen is supplied from the nitrogen gas flow-rate control 331 at a flow rate of 50 sccm (or 1 to 50 sccm in an embodiment; hydrogen flow rate>nitrogen flow rate) via the valve 332, to supply a mixed gas of H2 and N2. Although not illustrated in FIG. 14, the high-frequency shower 302 is impressed with electricity so that high-frequency power (0.1 to 30 MHz, 100 to 1,000 W) is applied between the shower and the heater stage 303 in order to generate hydrogen/nitrogen plasma through matching adjustment. At this time, the process pressure is set between 200 and 500 Pa. The process time is set to approx. 1 to 10 seconds. After this step, the purge step is performed. Here, the hydrogen/nitrogen introduction valve 311 is closed and evacuation is performed for approx. 1 second.

TABLE 2

| | | | step | | | |
| FIG. 14 No | Type | Flow gas | Ta pulse | Ta purge | H2/N2 pulse | purge |
| --- | --- | --- | --- | --- | --- | --- |
| 306 | Valve | Ar Flow | OFF | ON(400) | ON(400) | ON(400) |
| 307 | Valve | Ta Material | ON (400) | OFF | OFF | OFF |
| 308 | Valve | Ar Flow | ON(400) | ON(400) | ON(400) | ON(400) |
| 309 | Valve | Ru Material | OFF | OFF | OFF | OFF |
| 310 | Valve | Purge Ar Flow | ON(400) | ON(400) | ON(400) | ON(400) |
| 311 | Valve | H2 Flow | OFF | OFF | ON(RF) | OFF |
| 312 | Valve | Ru Material Bypass | OFF | OFF | OFF | OFF |
| 313 | Valve | Ru Material Out | ON | ON | ON | ON |
| 314 | Valve | Ru Material In | ON | ON | ON | ON |
| 315 | Valve | Ta Material Bypass | OFF | OFF | OFF | OFF |
| 316 | Valve | Ta Material Out | ON | ON | ON | ON |
| 317 | Valve | Ta Material In | ON | ON | ON | ON |

TABLE 2-continued

| FIG. 14 No | Type | Flow gas | step | | | |
|---|---|---|---|---|---|---|
| | | | Ta pulse | Ta purge | H2/N2 pulse | purge |
| 318 | MFC | Ar Flow | 0 sccm | 0 sccm | 0 sccm | 0 sccm |
| 319 | MFC | Ar Flow | 400 sccm | 0 sccm | 0 sccm | 0 sccm |
| 320 | MFC | H2 Flow | 0 sccm | 0 sccm | 500 sccm | 0 sccm |
| 321 | MFC | Ar Flow | 400 sccm | 400 sccm | 400 sccm | 400 sccm |
| 331 | MFC | N2 Flow | 0 | 0 | 50 sccm | 0 |

Next, implementation of the Ru atomic layer deposition process is explained using Table 3. A Ru atomic layer can be formed in the same procedure applicable to atomic layer deposition using Ta material. Since this process could be implemented in the same procedure as the Ru atomic layer deposition process in Example 1, except that H2/N2 plasma was used, repetitive descriptions are omitted.

TABLE 3

| FIG. 14 No | Type | Flow gas | step | | | |
|---|---|---|---|---|---|---|
| | | | Ru pulse | Pu Purge | H/N22 pulse | H2 purge |
| 306 | Valve | Ar Flow | ON(400) | ON(400) | ON(400) | ON(400) |
| 307 | Valve | Ta Material | OFF | OFF | OFF | OFF |
| 308 | Valve | Ar Flow | OFF | ON(400) | ON(400) | ON(400) |
| 309 | Valve | Ru Material | ON(400) | OFF | OFF | OFF |
| 310 | Valve | Purge Ar Flow | ON(400) | ON(400) | ON(400) | ON(400) |
| 311 | Valve | H2 Flow | OFF | OFF | ON(RF) | OFF |
| 312 | Valve | Ru Material Bypass | OFF | OFF | OFF | OFF |
| 313 | Valve | Ru Material Out | ON | ON | ON | ON |
| 314 | Valve | Ru Material In | ON | ON | ON | ON |
| 315 | Valve | Ta Material Bypass | OFF | OFF | OFF | OFF |
| 316 | Valve | Ta Material Out | ON | ON | ON | ON |
| 317 | Valve | Ru Material In | ON | ON | ON | ON |
| 318 | MFC | Ar Flow | 400 sccm | 0 sccm | 0 sccm | 0 sccm |
| 319 | MFC | Ar Flow | 0 sccm | 0 sccm | 0 sccm | 0 sccm |
| 320 | MFC | H2 Flow | 0 sccm | 0 sccm | 500 sccm | 0 sccm |
| 321 | MFC | Ar Flow | 400 sccm | 400 sccm | 400 sccm | 400 sccm |
| 331 | MFC | N2 Flow | 0 | 0 | 50 sccm | 0 |

According to the procedure in Table 3, after the Ru pulsing and Ru purge the following hydrogen/nitrogen plasma step is implemented. Here, hydrogen is supplied from the hydrogen gas flow-rate control 320 at a flow rate of 500 sccm (or 200 to 1,000 sccm in an embodiment) by opening the hydrogen gas supply valve 311. At the same time, nitrogen is supplied from the nitrogen gas flow-rate control 331 at a flow rate of 50 sccm (or 1 to 50 sccm in an embodiment) via the valve 332, to supply a mixed gas of H2 and N2. Although not illustrated in FIG. 14, the high-frequency shower 302 is impressed with electricity so that high-frequency power (0.1 to 30 MHz, 100 to 1,000 W) is applied between the shower and the heater stage 303 in order to generate hydrogen/nitrogen plasma through matching adjustment. At this time, the process pressure is set between 200 and 500 Pa. The process time is set to approx. 1 to 10 seconds. After this step, the purge step is performed. Here, the hydrogen/nitrogen introduction valve 311 is closed and evacuation is performed for approx. 1 second.

The above explained the Ta atomic layer deposition process and Ru atomic layer deposition process. These processes are repeated alternately, but the specific sequence such as performing the Ta cycle once (typically once or twice) and Ru cycle twice (typically in a range of once to 10 times), etc., can be adjusted in order to optimize the filling by Cu. Also, the same procedure can be followed in an embodiment where the Ti atomic layer deposition process, etc., is used instead of the Ta atomic layer deposition process.

Similarly when forming a RuTa carbide constituting the RuTa alloy 256, RuTa alloy is formed using hydrogen plasma alone as shown in FIG. 9. This sequence can be implemented in the same manner as in Example 1 under the conditions shown in Tables 4 and 5. Basically, the sequence can be achieved by reading "N2/N2 gas introduction" as "H2 gas instruction" in Tables 2 and 3.

TABLE 4

| | | | step | | | |
|---|---|---|---|---|---|---|
| FIG. 14 No | Type | Flow gas | Ta pulse | Ta purge | H2 pulse | purge |
| 306 | Valve | Ar Flow | OFF | ON(400) | ON(400) | ON(400) |
| 307 | Valve | Ta Material | ON (400) | OFF | OFF | OFF |
| 308 | Valve | Ar Flow | ON(400) | ON(400) | ON(400) | ON(400) |
| 309 | Valve | Ru Material | OFF | OFF | OFF | OFF |
| 310 | Valve | Purge Ar Flow | ON(400) | ON(400) | ON(400) | ON(400) |
| 311 | Valve | H2 Flow | OFF | OFF | ON(RF) | OFF |
| 312 | Valve | Ru Material Bypass | OFF | OFF | OFF | OFF |
| 313 | Valve | Ru Material Out | ON | ON | ON | ON |
| 314 | Valve | Ru Material In | ON | ON | ON | ON |
| 315 | Valve | Ta Material Bypass | OFF | OFF | OFF | OFF |
| 316 | Valve | Ta Material Out | ON | ON | ON | ON |
| 317 | Valve | Ru Material In | ON | ON | ON | ON |
| 318 | MFC | Ar Flow | 0 sccm | 0 sccm | 0 sccm | 0 sccm |
| 319 | MFC | Ar Flow | 400 sccm | 0 sccm | 0 sccm | 0 sccm |
| 320 | MFC | H2 Flow | 0 sccm | 0 sccm | 500 sccm | 0 sccm |
| 321 | MFC | Ar Flow | 400 sccm | 400 sccm | 400 sccm | 400 sccm |
| 331 | MFC | N2 Flow | 0 | 0 | 0 | 0 |

TABLE 5

| | | | step | | | |
|---|---|---|---|---|---|---|
| FIG. 14 No | Type | Flow gas | Ru pulse | Pu Purge | H2 pulse | H2 purge |
| 306 | Valve | Ar Flow | ON(400) | ON(400) | ON(400) | ON(400) |
| 307 | Valve | Ta Material | OFF | OFF | OFF | OFF |
| 308 | Valve | Ar Flow | OFF | ON(400) | ON(400) | ON(400) |
| 309 | Valve | Ru Material | ON(400) | OFF | OFF | OFF |
| 310 | Valve | Purge Ar Flow | ON(400) | ON(400) | ON(400) | ON(400) |
| 311 | Valve | H2 Flow | OFF | OFF | ON(RF) | OFF |
| 312 | Valve | Ru Material Bypass | OFF | OFF | OFF | OFF |
| 313 | Valve | Ru Material Out | ON | ON | ON | ON |
| 314 | Valve | Ru Material In | ON | ON | ON | ON |
| 315 | Valve | Ta Material Bypass | OFF | OFF | OFF | OFF |
| 316 | Valve | Ta Material Out | ON | ON | ON | ON |
| 317 | Valve | Ru Material In | ON | ON | ON | ON |
| 318 | MFC | Ar Flow | 400 sccm | 0 sccm | 0 sccm | 0 sccm |
| 319 | MFC | Ar Flow | 0 sccm | 0 sccm | 0 sccm | 0 sccm |
| 320 | MFC | H2 Flow | 0 sccm | 0 sccm | 500 sccm | 0 sccm |
| 321 | MFC | Ar Flow | 400 sccm | 400 sccm | 400 sccm | 400 sccm |
| 331 | MFC | N2 Flow | 0 | 0 | 0 | 0 |

As shown in FIG. 6(c), a Cu film was formed on each of these laminate films by means of Cu-CVD using (trimethylvinylsilyl)hexafluoroacetylacetonato copper to fill a via hole. (The via size was 75 nm in diameter and the aspect ratio was 2.7.)

In this example, as shown in FIGS. 15 and 16, favorable filling characteristics were also obtained by one Ta cycle and two Ru cycles. Similarly with a dual damascene structure, the via hole could be filled in a favorable manner. With a via hole of 50 nm in diameter, the via hole could be filled by forming a Cu film of approx. 25 to 30 nm. The steps shown in FIGS. 10(d) and (e) could be implemented because the Cu-CVD seed layer 258 in FIG. 10(c) was 25 to 30 nm and could sufficiently function as a seed layer for electrolytic plating.

With the Ta material and Ru material used in this example, favorable filling can be achieved when the Ru/(Ta+Ru) atomic ratio is in a range of 70 to 95%.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A method for forming interconnect wiring, comprising:
   (i) covering a surface of a connection hole penetrating through interconnect dielectric layers formed on a substrate for interconnect wiring, with an underlying alloy layer selected from the group consisting of a film of an alloy containing ruthenium (Ru) and at least one other metal atom (M) wherein M is Ti or Ta, a nitride film of the alloy, a carbide film of the alloy, and a nitride-carbide film of the alloy, by atomic layer deposition comprising supplying a Ru precursor and an M precursor alternately in cycles wherein the Ru precursor is supplied in two pulses per one pulse of the M precursor supplied in one cycle; and
   (ii) filling copper or a copper compound by CVD into at least a part of the connection hole covered with the underlying alloy layer.

2. The method according to claim 1, further comprising covering a surface of the connection hole with a copper diffusion barrier layer prior to step (i).

3. The method according to claim 2, wherein the barrier layer is a film constituted by a material selected from the group consisting of TaN, Ta, TaNC, TaSiN, TIN, Ti, TiNC, and TiSiN.

4. The method according to claim 2, wherein the barrier layer is a film constituted by a material selected from the group consisting of RuTaN, RuTaNC, RuTiN, RuTiNC, RuN, and RuNC.

5. The method according to claim 1, wherein in step (i), the underlying alloy layer is formed as a copper diffusion barrier layer.

6. The method according to claim 5, wherein a wiring groove communicated with the interconnection hole is further formed above the interconnection hole in the interconnect dielectric layers, and in step (i), a surface of the wiring groove is also covered with the underlying alloy layer.

7. The method according to claim 5, wherein in step (ii), the copper or the copper compound is filled into the interconnection hole substantially or nearly in its entirety.

8. The method according to claim 5, further comprising filling copper by electrolytic plating into the remaining part of the interconnection hole which is not filled with the copper or the copper compound by CVD in step (ii), wherein a layer formed by CVD in step (ii) is used as a copper seed layer.

9. The method according to claim 6, further comprising filling copper by electrolytic plating into the remaining part of the interconnection hole which is not filled with the copper or the copper compound by CVD in step (ii) and the wiring groove, wherein the a layer formed by CVD in step (ii) is used as a copper seed layer.

10. The method according to claim 1, wherein the underlying alloy layer is a laminate comprised of the nitride film or the nitride-carbide film as a first layer and the carbide film as a second layer.

11. The method according to claim 10, wherein step (i) comprises controlling supply of a Ru precursor and supply of an M precursor to adjust an atomic ratio of Ru/(Ru+M) of the underlying layer at 0.6 to 0.9 for the first layer and then at 0.7 to 0.95 for the second layer.

12. The method according to claim 11, wherein the first layer is formed using a hydrogen-nitrogen plasma whereas the second layer is formed using a hydrogen plasma.

13. The method according to claim 1, wherein an atomic ratio of Ru/(Ru+M) of the underlying alloy layer is at about 0.6 to about 0.9.

14. The method according to claim 1, wherein step (i) comprises adjusting the atomic ratio of Ru/(Ru+M) of the underlying alloy layer by using a hydrogen plasma or a hydrogen-nitrogen plasma.

15. The method according to claim 1, wherein the Ru precursor is a β-diketone-coordinated ruthenium compound.

16. The method according to claim 1, wherein the atomic layer deposition utilizes a plasma.

17. The method according to claim 13, wherein a proportion of Ru in the underlying alloy layer at a bottom of the connection hole is higher than that at a side wall of the connection hole or at an upper surface of the substrate.

18. The method according to claim 17, wherein the underlying alloy layer at the bottom contains less C and/or N than at the side wall or the upper surface.

19. The method according to claim 17, wherein the proportion of Ru is adjusted by applying bias voltage to the substrate.

20. The method according to claim 1, wherein step (i) comprises:
   (I) conducting atomic deposition of M one time, the atomic deposition of M comprising supplying the M precursor and supplying a gas chemically reactive to the M precursor;
   (II) after step (I), conducting atomic deposition of Ru two times, each atomic deposition of Ru comprising supplying the Ru precursor and supplying a reduction gas, and
   (III) repeating steps (I) and (II) Z times, thereby forming a M-Ru alloy layer as the underlying alloy layer.

21. The method according to claim 20, wherein step (II) comprises applying radio-frequency power to the reduction gas to generate a plasma of the reduction gas.

22. The method according to claim 20, wherein the reduction gas is hydrogen gas or a mixed gas of hydrogen gas and nitrogen gas.

23. The method according to claim 21, wherein step (II) comprises applying negative potential to a heating support on which the substrate is placed.

* * * * *